United States Patent
Sugiura et al.

(10) Patent No.: US 8,847,251 B2
(45) Date of Patent: Sep. 30, 2014

(54) SUBSTRATE, LIGHT-EMITTING DEVICE, AND LIGHTING APPARATUS HAVING A LARGEST GAP BETWEEN TWO LINES AT LIGHT-EMITTING ELEMENT MOUNTING POSITION

(71) Applicant: Panasonic Corporation, Osaka (JP)

(72) Inventors: Kenji Sugiura, Osaka (JP); Masumi Abe, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/877,940

(22) PCT Filed: Oct. 18, 2012

(86) PCT No.: PCT/JP2012/006678
§ 371 (c)(1),
(2), (4) Date: Apr. 5, 2013

(87) PCT Pub. No.: WO2013/136389
PCT Pub. Date: Sep. 19, 2013

(65) Prior Publication Data
US 2014/0054628 A1    Feb. 27, 2014

(30) Foreign Application Priority Data

Mar. 13, 2012    (JP) .................................. 2012-055424

(51) Int. Cl.
| | | |
|---|---|---|
| H01L 33/00 | (2010.01) | |
| H01L 33/62 | (2010.01) | |
| H05K 1/18 | (2006.01) | |
| H01L 27/15 | (2006.01) | |
| H01L 25/075 | (2006.01) | |

(52) U.S. Cl.
CPC ................ H05K 1/181 (2013.01); H01L 33/62 (2013.01); *H01L 2924/0002* (2013.01); H01L 27/153 (2013.01); H01L 25/0753 (2013.01)
USPC ........................................... 257/91; 174/261

(58) Field of Classification Search
CPC ................. H01L 2224/48091; H01L 2924/00; H01L 2924/00014; H01L 25/0753; H01L 33/50; H01L 33/486; H01L 33/54; H01L 33/642; H01L 27/153; H01L 33/52; H01L 33/647; H01L 33/62
USPC ........................................... 257/91; 174/261
See application file for complete search history.

(56) References Cited

U.S. PATENT DOCUMENTS

| | | |
|---|---|---|
| 7,982,230 B2 | 7/2011 | Masuko |
| 8,049,233 B2 | 11/2011 | Fukshima et al. |

(Continued)

FOREIGN PATENT DOCUMENTS

| | | |
|---|---|---|
| CN | 101194374 | 6/2008 |
| CN | 101819967 | 9/2010 |

(Continued)

OTHER PUBLICATIONS

Search report from E.P.O., mail date is Dec. 5, 2013.

(Continued)

*Primary Examiner* — Duy T Nguyen
(74) *Attorney, Agent, or Firm* — Greenblum & Bernstein, P.L.C.

(57) ABSTRACT

A substrate on which LEDs are to be mounted to form an element row and which includes a first line and a second line disposed such that the element row is interposed therebetween. The first line includes a first main line portion extending mainly in the row direction of the element row, and a first connecting portion including a portion for connecting to the LEDs. The second line includes a second main line portion extending mainly in the row direction of the element row, and a second connecting portion including a portion for connecting to the LEDs. The gap between the first main line portion and the second main line portion is larger at LED mounting positions than at positions other than the LED mounting positions.

15 Claims, 19 Drawing Sheets

(56) References Cited

U.S. PATENT DOCUMENTS

| | | | |
|---|---|---|---|
| 8,403,532 | B2 | 3/2013 | Yamashita et al. |
| 8,556,455 | B2 | 10/2013 | Hayashi |
| 2008/0258169 | A1 | 10/2008 | Masuko |
| 2009/0224265 | A1 | 9/2009 | Wang et al. |
| 2010/0103680 | A1* | 4/2010 | Oyaizu et al. ............... 362/294 |
| 2010/0220479 | A1 | 9/2010 | Yamashita et al. |
| 2011/0019420 | A1 | 1/2011 | Kadotani et al. |
| 2011/0122341 | A1 | 5/2011 | Hayashi |
| 2011/0254023 | A1 | 10/2011 | Shibusawa et al. |
| 2011/0260646 | A1 | 10/2011 | Moon et al. |
| 2012/0043560 | A1* | 2/2012 | Wu et al. ..................... 257/88 |
| 2012/0061716 | A1 | 3/2012 | Yu et al. |
| 2012/0106125 | A1 | 5/2012 | Yokotani et al. |
| 2012/0169968 | A1 | 7/2012 | Ishimori et al. |
| 2012/0236229 | A1 | 9/2012 | Matsuhisa |
| 2012/0256538 | A1 | 10/2012 | Takeuchi et al. |

FOREIGN PATENT DOCUMENTS

| | | |
|---|---|---|
| EP | 2306070 | 4/2011 |
| EP | 2421038 | 2/2012 |
| EP | 2469593 | 6/2012 |
| JP | 2011-176017 | 9/2011 |
| JP | 2011-233892 | 11/2011 |
| JP | 2011-243935 | 12/2011 |
| JP | 2012-15466 | 1/2012 |
| JP | 2012-15467 | 1/2012 |
| JP | 2012-134306 | 7/2012 |
| WO | WO2010115296 | * 10/2010 |

OTHER PUBLICATIONS

Japan Office action, mail date is Feb. 26, 2013.
Search report from P.C.T., mail date is Apr. 12, 2012.
China Office action, dated Mar. 5, 2014 along with an english translation thereof.

* cited by examiner

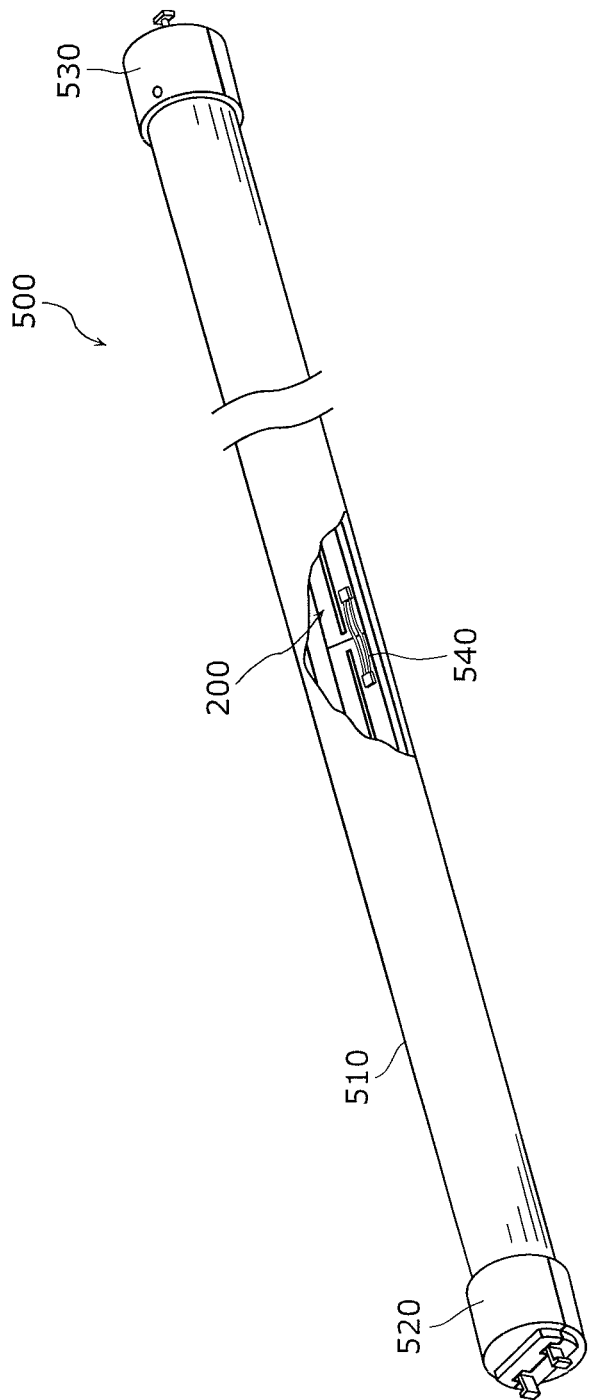

SUBSTRATE, LIGHT-EMITTING DEVICE, AND LIGHTING APPARATUS HAVING A LARGEST GAP BETWEEN TWO LINES AT LIGHT-EMITTING ELEMENT MOUNTING POSITION

CROSS REFERENCE TO RELATED APPLICATIONS

This application is a U.S. National Stage Application of International Application No. PCT/JP2012/006678, filed Oct.18, 2012, the disclosure of which is expressly incorporated by reference herein. The International Application was not published under PCT Article 21(2) in English.

This application claims priority of Japanese Patent Application No.2012-55424, filed Mar.13, 2012, the disclosures of which are expressly incorporated by reference herein.

TECHNICAL FIELD

The present invention relates to substrates, light-emitting devices, and lighting apparatuses, and in particular to a substrate on which semiconductor light-emitting elements are mounted, a light-emitting device using the semiconductor light-emitting elements, and a lighting apparatus using the light-emitting device.

BACKGROUND ART

In recent years, semiconductor light-emitting elements such as light emitting diodes (LEDs) have been widely used in various devices as highly efficient and space saving light sources, and are used, for example, as a backlight source in liquid crystal display apparatuses or as a light source for illumination in lighting apparatus such as a base light or a linear tube LED lamp. In this case, the LEDs are unitized as an LED module and included in various devices.

As such an LED module, Patent Literature (PTL) 1 discloses a COB (chip on board) light-emitting device which includes a substrate on which LED chips are mounted. The conventional light-emitting device disclosed by PTL 1 includes an element row including a plurality of LEDs linearly aligned on the substrate, and a phosphor-containing resin which collectively seals the LEDs (element row).

CITATION LIST

Patent Literature

[PTL 1] Japanese Unexamined Patent Application Publication No. 2011-176017

SUMMARY OF INVENTION

Technical Problem

The LED module includes a metal line formed into a predetermined shape for supplying power to the LED. For example, two metal lines are formed on the substrate such that the LED element row is interposed between the metal lines.

In this case, manufacturers of a product including the LED module as a component require ensuring of an insulation distance (distance between a live portion and an end of a substrate) in the LED module, and thus it is desired that the two metal lines are disposed inward of the substrate (center of the substrate) as much as possible.

Meanwhile, since enhanced light extraction efficiency is required for the LED module, it is preferable that absorption or reflection of LED light due to the metal lines be prevented and a desired reflection area be ensured around the LED. Accordingly, it is preferable that the metal lines be placed further away from the LED and it is desired that two metal lines are spaced apart as much as possible.

Thus, it can be conceived that the metal lines are narrowed down by reducing line widths of the metal lines, for meeting the both requirements.

However, narrowing down of the metal lines increases the wiring resistance. In this case, power which is supplied to the LED module needs to be increased in order to cause the LED to emit light with desired luminance, posing a problem that a forward voltage (Vf) of the LED increases.

In addition, it is also difficult to simply enlarge the width of the metal line in order to prevent increase in Vf. More specifically, when the width of the metal line is enlarged, the area where LED light is partially absorbed or reflected due to the metal line increases as described above, and thus light extraction efficiency decreases. Furthermore, enlarging the width of the metal line also leads to increase in costs. As described above, it has been necessary to sacrifice the suppression of the increase in Vf and the ensuring of insulation properties (insulation distance) in exchange for enhancing the light extraction efficiency (ensuring a light reflection preventing area around an LED, and so on).

In addition, since the metal line has an elongate shape according to the elongate shape of the substrate, and not copper with low resistivity but silver having a relatively high resistance value is more likely to be used as a material for the metal line, the wiring resistance tends to be high even when the metal line has the same width as that in a conventional technique. Furthermore, the metal line is formed through printing in many cases, and thus it is not easy to lower the resistivity by thickening the metal line.

The present invention has been conceived to solve the above-described problems and an object of the present invention is to provide a substrate and a light-emitting device which can suppress decrease in light extraction efficiency while suppressing increase in a voltage and ensuring an insulation distance.

Solution to Problem

In order to solve the above-described problem, an aspect of a substrate according to the present invention is a substrate on which a plurality of semiconductor light-emitting elements are to be linearly mounted to form an element row, the substrate including a first line and a second line which are disposed such that the element row is interposed therebetween, wherein the first line includes a first main line portion extending mainly in a row direction of the element row, and a first connecting portion connected to the first main line portion and including a portion for connecting to a corresponding one of the semiconductor light-emitting elements, the second line includes a second main line portion extending mainly in the row direction of the element row, and a second connecting portion connected to the second main line portion and including a portion for connecting to a corresponding one of the semiconductor light-emitting elements, and a gap between the first main line portion and the second main line portion is larger at element mounting positions at which the semiconductor light-emitting elements are to be mounted than at positions other than the element mounting positions.

In addition, in an aspect of the substrate according to the present invention, wherein the first line may include a plurality of the first connecting portions, the second line may include a plurality of the second connecting portions, the first main line portion may connect adjacent ones of the first connecting portions, the second main line portion may connect adjacent ones of the second connecting portions, the first connecting portions each may include a protruding portion which protrudes toward the second line in a region between adjacent ones of the element mounting positions, the protruding portion being a portion for connecting to a corresponding one of the semiconductor light-emitting elements, and the second connecting portions each may include a protruding portion which protrudes toward the first line in a region between adjacent ones of the element mounting positions, the protruding portion being a portion for connecting to a corresponding one of the semiconductor light-emitting elements.

In addition, in an aspect of the substrate according to the present invention, it is preferable that the first main line portion have a line width that is larger at a position close to the first connecting portions than at a position facing a corresponding one of the element mounting positions.

In addition, in an aspect of the substrate according to the present invention, it is preferable that the second main line portion have a line width that is larger at a position close to the second connecting portions than at a position facing a corresponding one of the element mounting positions.

In addition, in an aspect of the substrate according to the present invention, it is preferable that the first connecting portions and the second connecting portions be alternately placed in an aligned direction of the semiconductor light-emitting elements.

In addition, in an aspect of the substrate according to the present, invention, it is preferable that at least one of (i) an outline of the first main line portion facing the second line and (ii) an outline of the second main line portion facing the first line be curved.

In addition, in an aspect of the substrate according to the present invention, the element row may include a first element row and a second element row each of which includes the plurality of semiconductor light-emitting elements, the substrate may further comprise a third line, the first line and the second line may be disposed such that the first element row is interposed therebetween, the second line and the third line may be disposed such that the second element row is interposed therebetween, the third line may include a third main line portion extending mainly in an row direction of the second element row, and a third connecting portion connected to the third main line portion and including a portion for connecting to a corresponding one of the semiconductor light-emitting elements in the second element row, the third connecting portion may include a protruding portion which protrudes toward the second line in a region between adjacent ones of the element mounting positions in the second element row, the protruding portion being a portion for connecting to a corresponding one of the semiconductor light-emitting elements in the second element row, the second connecting portion may further include a protruding portion protruding toward the third line in a region between adjacent ones of the element mounting positions, a gap between the first main line portion and the second main line portion may be larger at the element mounting positions in the first element row than at positions other than the element mounting positions in the first element row, and a gap between the second main line portion and the third main line portion may be larger at the element mounting positions in the second element row than at positions other than the element mounting positions in the second element row.

In addition, in an aspect of the substrate according to the present invention, the element mounting positions in the first element row and the element mounting positions in the second element row may be alternately placed to avoid facing each other, and the second line may be formed to protrude alternately to a region between adjacent ones of the element mounting positions in the first element row and to a region between adjacent ones of the element mounting positions in the second element row.

In addition, in an aspect of the substrate according to the present invention, it is preferable that the substrate be a ceramic substrate.

In addition, in an aspect of the substrate according to the present invention, a phosphor layer may be formed around each of the element mounting positions.

In addition, in an aspect of a light-emitting device according to the present invention, the light-emitting device includes: a substrate; an element row including a plurality of semiconductor light-emitting elements mounted linearly on the substrate; and a first line and a second line which are disposed such that the element row is interposed therebetween, wherein the first line includes a first main line portion extending mainly in the row direction of the element row, and a first connecting portion connected to the first main line portion and including a portion for connecting to a corresponding one of the semiconductor light-emitting elements, the second line includes a second main line portion extending mainly in the row direction of the element row, and a second connecting portion connected to the second main line portion and including a portion for connecting to a corresponding one of the semiconductor light-emitting elements, and a gap between the first main line portion and the second main line portion is larger at element mounting positions of the semiconductor light-emitting elements than at positions other than the element mounting positions.

In addition, in an aspect of the light-emitting device according to the present invention, the first line may include a plurality of the first connecting portions, the second line may include a plurality of the second connecting portions, the first main line portion may connect adjacent ones of the first connecting portions, the second main line portion may connect adjacent ones of the second connecting portions, the first connecting portions may each include a protruding portion which protrudes toward the second line in a region between adjacent ones of the element mounting positions, the protruding portion being a portion for connecting to a corresponding one of the semiconductor light-emitting elements, and the second connecting portions may each include a protruding portion which protrudes toward the first line in a region between adjacent ones of the element mounting positions, the protruding portion being a portion for connecting to a corresponding one of the semiconductor light-emitting elements.

In addition, in an aspect of the light-emitting device according to the present invention, the element row may include a first element row and a second element row each of which includes the plurality of semiconductor light-emitting elements, the light-emitting device may further comprise a third line, the first line and the second line may be disposed such that the first element row is interposed therebetween, the second line and the third line may be disposed such that the second element row is interposed therebetween, the third line may include a third main line portion extending mainly in a row direction of the second element row, and a third connecting portion connected to the third main line portion for connecting to a corresponding one of the semiconductor light-emitting elements in the second element row, the third connecting portion may include a protruding portion which protrudes toward the second line in a region between adjacent ones of the element mounting positions in the second element row, the protruding portion being a portion for connecting to a corresponding one of the semiconductor light-emitting elements in the second element row, the second connecting portion may further include a protruding portion which protrudes toward the third line in a region between adjacent ones of the element mounting positions which are adjacent to each other, a gap between the first main line portion and the second main line portion may be larger at element mounting positions of the semiconductor light-emitting elements in the first element row than at positions other than the element mounting positions of the semiconductor light-emitting elements in the first element row, and a gap between the second main line portion and the third main line portion may be larger at element mounting positions of the semiconductor light-emitting elements in the second element row than at positions other than the element mounting positions of the semiconductor light-emitting elements in the second element row.

In addition, in an aspect of the light-emitting device according to the present invention, the semiconductor light-emitting elements in the first element row and the semiconductor light-emitting elements in the second element row may be alternately mounted to avoid facing each other, and the second line may be formed to protrude alternately to a region between adjacent ones of the semiconductor light-emitting elements in the first element row and to a region between adjacent ones of the semiconductor light-emitting elements in the second element row.

In addition, in an aspect of the light-emitting device according to the present invention, may further include a sealing member which has a linear shape, includes a light wavelength converter, and collectively seals the semiconductor light-emitting elements.

In addition, in an aspect of a lighting apparatus according to the present invention, the lighting apparatus includes the light-emitting device described above.

Advantageous Effects of Invention

According to the present invention, it is possible to ensure an insulation distance and prevent decrease in light extraction efficiency, while preventing increase in a voltage.

BRIEF DESCRIPTION OF DRAWINGS

FIG. 3 is a partially enlarged view of the light-emitting device according to Embodiment 1 of the present invention.

FIG. 5 is a partially enlarged view of a mounting board according to Embodiment 2 of the present invention.

FIG. 7 is a perspective overview of a lighting apparatus according to Embodiment 4 of the present invention.

FIG. 8A is a diagram illustrating a first specific example of the lighting apparatus according to Embodiment 4 of the present invention.

FIG. 8B is a diagram illustrating a second specific example of the lighting apparatus according to Embodiment 4 of the present invention.

FIG. 8C is a diagram illustrating a third specific example of the lighting apparatus according to Embodiment 4 of the present invention.

FIG. 10 is a partially enlarged plan view of a mounting board and a light-emitting device according to Modification 1 of the present invention.

FIG. 11 is a partially enlarged plan view of a mounting board according to Modification 2 of the present invention.

FIG. 12 is a partially enlarged plan view of a mounting board according to Modification 3 of the present invention.

FIG. 13 is a partially enlarged plan view of a mounting board according to Modification 4 of the present invention.

FIG. 14 is a partially enlarged plan view of a mounting board according to Modification 5 of the present invention.

FIG. 15 is a partially enlarged plan view of a mounting board according to Modification 6 of the present invention.

FIG. 16 is a partially enlarged plan view of a mounting board according to Modification 7 of the present invention.

FIG. 17 is a partially enlarged plan view of a mounting board according to Modification 8 of the present invention.

FIG. 18 is a partially enlarged plan view of a mounting board according to Modification 9 of the present invention.

FIG. 19A is a partially enlarged plan view of a mounting board according to Comparison 3 of the present invention.

FIG. 19B is a partially enlarged plan view of a mounting board according to Modification 10 of the present invention.

FIG. 20A is a partially enlarged plan view of a mounting board according to Comparison 4 of the present invention.

FIG. 20B is a partially enlarged plan view of a mounting board according to Modification 11 of the present invention.

[FIG. 21] FIG. 21 is a perspective view of a source for illumination according to Modification 12 of the present invention.

FIG. 22 is a perspective view of a lighting apparatus according to Modification 13 of the present invention.

FIG. 23 is a cross-sectional view of a liquid-crystal display apparatus according to Modification 14 of the present invention.

DESCRIPTION OF EMBODIMENTS

The following describes in detail exemplary embodiments according to the present invention with reference to the drawings. It is to be noted that each of the exemplary embodiments described below shows a preferable specific example of the present invention. In addition, numerical values, shapes, materials, structural elements, the arrangement and connection of the structural elements, and so on shown in the following exemplary embodiments are mere examples, and therefore do not limit the scope of the present invention. Therefore, among the structural elements in the following exemplary embodiments, structural elements not recited in any one of the independent claims which represent the most generic concepts are described as structural elements not indispensable for achieving the object of the present invention but included for more preferred configuration. It is to be noted that each of the diagrams is a pattern diagram and thus is not necessarily exactly illustrated.

[Embodiment 1]

Figure 1:
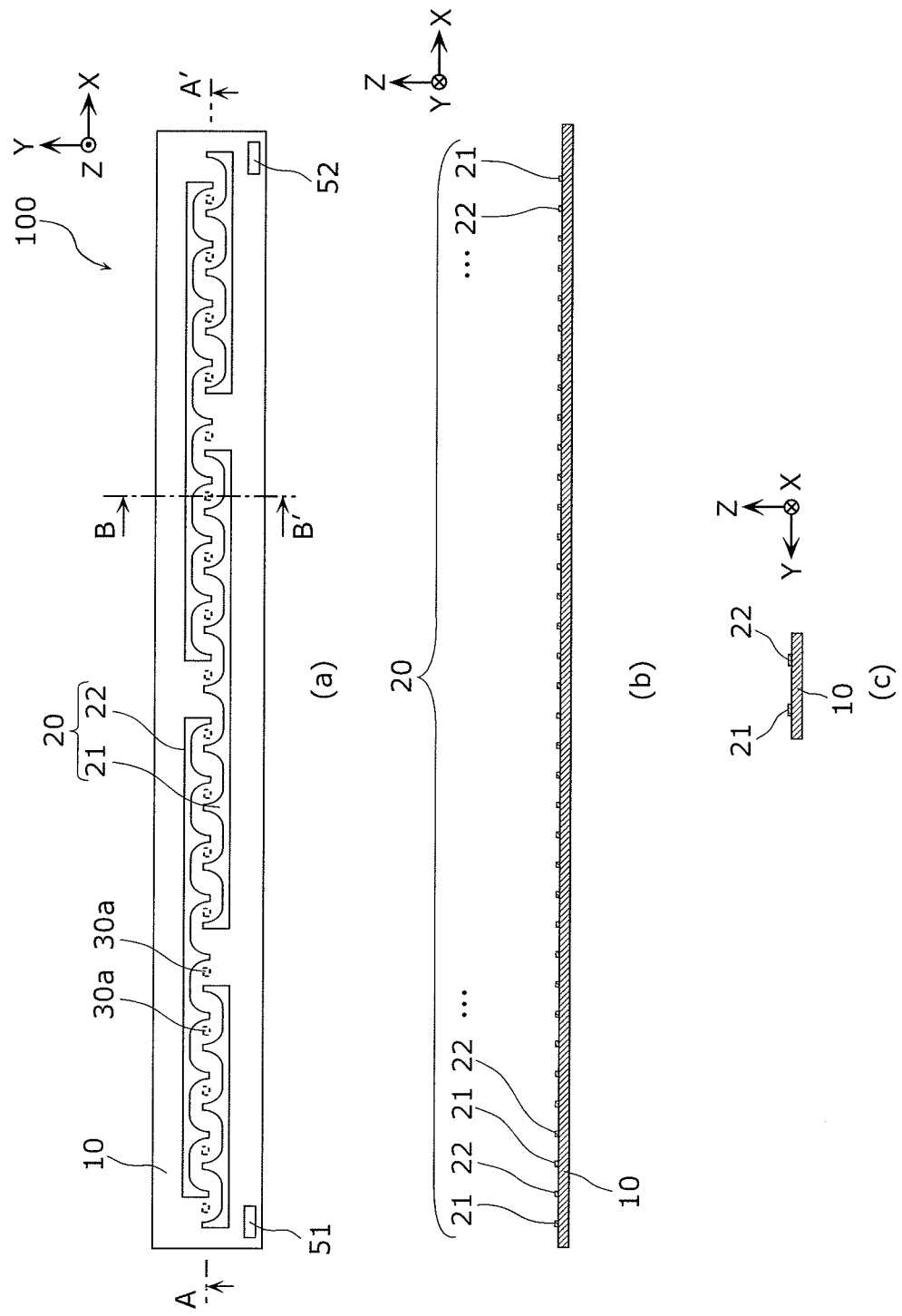
[FIG. 1] (a) in FIG. 1 is a plan view of a mounting board according to Embodiment 1 of the present invention, (b) in FIG. 1 is a cross-sectional view of the mounting board which is taken from the line A-A' of (a) in FIG. 1, and (c) in FIG. 1 is a cross-sectional view of the mounting board which is taken from the line B-B' of (a) in FIG. 1.

First, a configuration of a mounting board 100 according to Embodiment 1 of the present invention will be described with reference to FIG. 1. (a) in FIG. 1 is a plan view of a mounting board according to Embodiment 1 of the present invention, (b) in FIG. 1 is a cross-sectional view of the mounting board (cross-section surface in a longitudinal direction of the substrate) which is taken from the line A-A' of (a), and (c) in FIG. 1 is a cross-sectional view of the mounting board (cross-section surface in a crosswise direction of the substrate) which is taken from the line B-B' of (a). It is to be noted that the longitudinal direction of the substrate 10 refers to an axis X direction, the crosswise direction of the substrate 10 orthogonal to the axis X refers to an axis Y direction, and a direction orthogonal to the axis X and the axis Y and perpendicular to a main surface of the substrate 10 refers to an axis Z direction.

As shown in (a) to (c) in FIG. 1, the mounting board 100 according to this exemplary embodiment is an LED mounting board for mounting an LED, includes a substrate 10 and a line 20 that has a predetermined shape and is formed on the substrate 10. In this exemplary embodiment, a plurality of LEDs are linearly mounted as an element row (LED element row) on the substrate 10. The LEDs are mounted on the substrate 10 at LED mounting positions 30*a* (positions at which the LEDs are to be mounted). It is to be noted that a first electrode 51 and a second electrode 52 which are electrically connected to the line 20 are also formed on the substrate 10.

[Substrate]

In this exemplary embodiment, the substrate 10 is a substrate which has an elongate rectangle shape. When the length of substrate 10 in the longitudinal direction (the axis X direction) that is a direction along an elongate side (length of the long side) is L1, and the length of substrate 10 in the crosswise direction (the axis Y direction) (length of the long side) is L2, it is preferable that the aspect ratio L1/L2 of the substrate 10 be set such that L1/L2≥10. It is possible to use, for example, the substrate 10 of which L1=280 mm, L2=15 mm (an aspect ratio of 18.67), and a thickness is 1.0 mm.

A ceramic substrate that comprises alumina or translucent aluminum nitride, a metal base substrate of which the base is a metal such as an aluminum alloy, a copper alloy, and the like, a transparent glass substrate, or a resin substrate that comprises a transparent or non-transparent resin can be used as the substrate 10. A glass epoxy substrate or the like can be used as the resin substrate. Alternatively, a flexible substrate (FPC) or the like which has a flexible property can be used as the substrate 10.

However, it is preferable that the substrate 10 be made of a material having high thermal conductivity and thermal emittance in order to enhance the heat dissipation performance of the LED to be mounted, and that a substrate made of a material called a hard brittle material such as the glass substrate and the ceramic substrate be used as the substrate 10. In addition, the substrate 10 may be configured such that light is emitted from a rear face of the substrate 10, and in this case, it is preferable that the substrate 10 have a high transmittance. It is to be noted that, when a metal base substrate such as an aluminum substrate is used, an insulating film made of an organic material such as polyimide is formed on a surface of the substrate 10.

[Line]

The line 20, which is for supplying power to the LEDs mounted on the substrate 10, is patterned on the surface of the substrate 1 into a predetermined shape. Accordingly, the line 20 is electrically connected to the LEDs mounted. It is to be noted that the LEDs mounted can be connected in series or in parallel by arbitrarily changing the pattern (shape) of the line 20.

The line 20 is formed of a metal line or the like which includes a conductive member such as a metal, and may be a silver line formed of silver (Ag), for example. The line 20 according to this exemplary embodiment comprises silver (Ag) as a base metal, and an Ag line coated by gold through gold plating is used as the line 20. It is to be noted that a copper line made of copper (Cu) or a tungsten line made of tungsten (W) may be used as a material for the line 20.

In addition, it is preferable that the line 20 be covered by an insulating film. In this case, an insulating resin film or a glass coating film such as a resist having reflectivity and insulation properties can be used as the insulating film. For example, a white resin material (white resist) having a high reflectance of approximately 98% can be used as the insulating film, and the insulating film is formed on the entire surface of the substrate 10 other than a wire connecting portion (land) of the line 20. As described above, light emitted from an LED 30 (sealing member 40) can be reflected by entirely covering the substrate 10 as well as the line 20 with the white resist or the glass coating film, and thus it is possible to enhance the light extraction efficiency.

The line 20 includes the first line 21 and a second line 22. The first line 21 and the second line 22 are arranged such that an LED element row is interposed by the first line 21 and the second line 22 when LEDs are aligned at the LED mounting positions 30*a* on the substrate 10. More specifically, the first line 21 and the second line 22 are arranged to face each other across the LED element row after the LEDs are mounted, in the longitudinal direction so as to be along the element aligned direction of the LED element row.

In this exemplary embodiment, each of the first line 21 and the second line 22 is divided into a plurality of portions through patterning. Each of the first line 21 and the second line 22 which are divided into a plurality of portions includes a positive voltage supply line which supplies a positive voltage to the LEDs and a negative voltage supply line which supplies a negative voltage to the LEDs, and has a positive potential or a negative potential according to power supplied from the first electrode 51 and the second electrode 52. The portions of each of the divided lines can be connected such that all of the portions of the divided first lines 21 are positive voltage supply lines and all of the portions of the divided second lines 22 are negative voltage supply lines, for example.

[Electrode]

The first electrode 51 and the second electrode 52 are power supply terminals (connectors) which receive power from an external power supply or the like for causing the LEDs to emit light, and electrically connected to the line 20. The first electrode 51 and the second electrode 52 can be physically and electrically connected by extending, for example, part of the line 20 into, although not illustrated, a predetermined shape.

Each of the LEDs is supplied with power via the line 20 and a wire, by supplying power from the external power supply to the first electrode 51 and the second electrode 52. It is possible to, for example, supply direct current to each of the LEDs by connecting a direct power supply to the first electrode 51 and the second electrode 52. With this configuration, each of the LEDs is caused to emit light and desired light is emitted from the LEDs A metal electrode (metal terminal) which comprises gold (Au), for example, can be employed as the first electrode 51 and the second electrode 52.

It is to be noted that each of the first electrode 51 and the second electrode 52 may be configured as a socket for connecting a connector line (harness) such as a lead. In this case, the socket may include a plurality of conductive pins which receive power supply for causing the LEDs to emit light and a socket body which is made of resin and on which the plurality of conductive pins are mounted, and the plurality of conductive pins are electrically connected to the line 20. In addition, a single socket may receive the positive voltage and the negative voltage, and the plurality of conductive pins, in this case, include a positive voltage pin for a positive voltage and a negative voltage pin for a negative voltage. It is to be noted that a socket of one of the LED modules and a socket of the other LED module are connected via a connector line, so that a plurality of LED modules are to be electrically connected.

Next, a configuration of a light-emitting device 200 according to Embodiment 1 of the present invention will be described with reference to FIG. 2. (a) in FIG. 2 is a plan view of a light-emitting device according to Embodiment 1 of the present invention, (b) in FIG. 2 is a cross-sectional view of the light-emitting device (cross-section surface in a longitudinal direction of the substrate) which is taken from the line A-A' of (a), and (c) in FIG. 2 is a cross-sectional view of the light-emitting device (cross-section surface in a crosswise direction of the substrate) which is taken from the line B-B' of (a).

Figure 2:
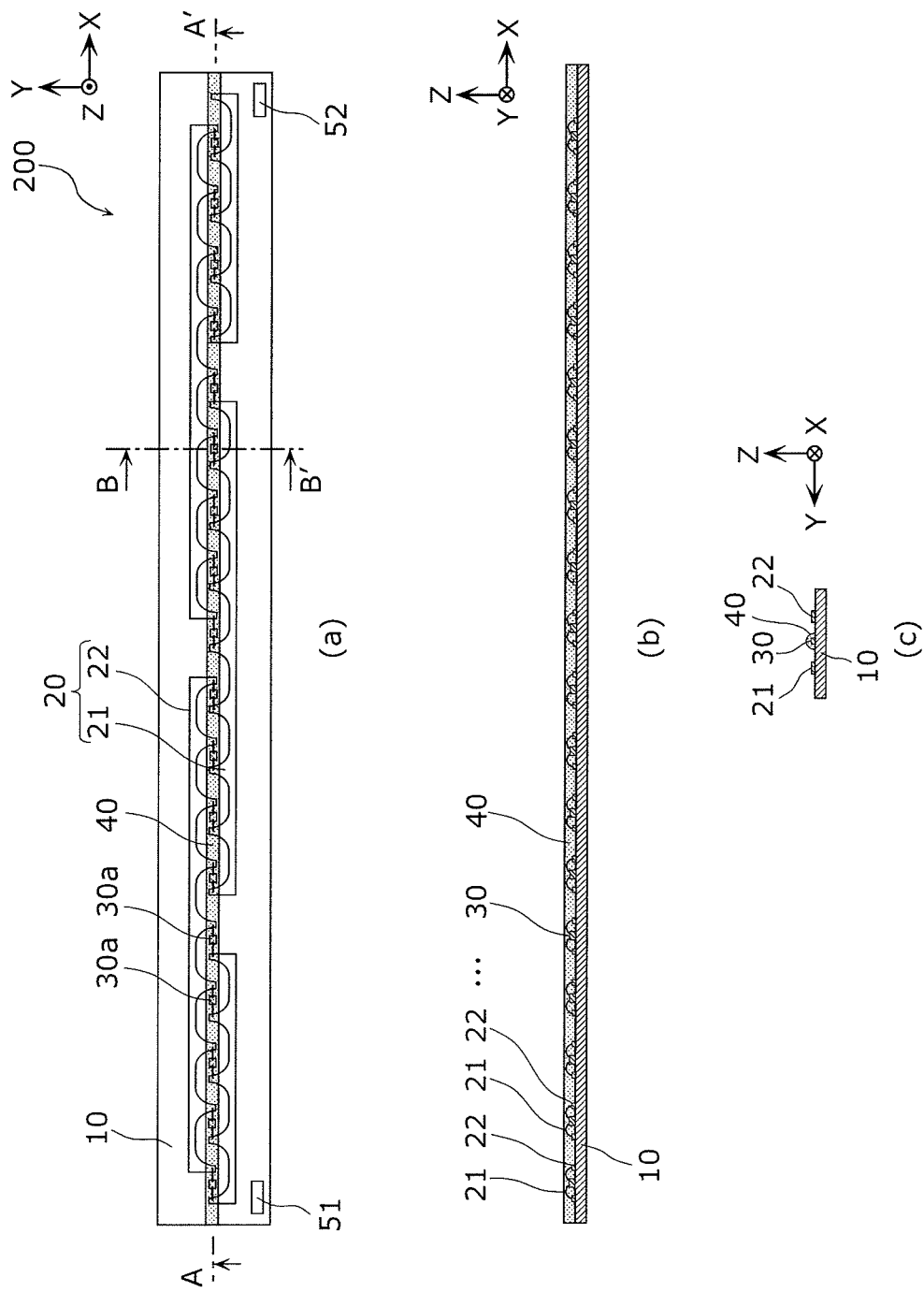
[FIG. 2] (a) in FIG. 2 is a plan view of a light-emitting device according to Embodiment 1 of the present invention, (b) in FIG. 2 is a cross-sectional view of the light-emitting device which is taken from the line A-A' of (a) in FIG. 2, and (c) in FIG. 2 is a cross-sectional view of the light-emitting device which is taken from the line B-B' of (a) in FIG. 2.

As shown in (a) to (c) in FIG. 2, the light-emitting device 200 according to this exemplary embodiment is a linear light source which emits light linearly (in a form of line) and formed using the above-described mounting board 100. The light-emitting device 200 is an LED module (light-emitting module) including a plurality of LED chips mounted on the substrate and is modularized, and is a light-emitting device of a COB type including the LED chips (bare chips) directly mounted on the substrate 10. The light-emitting device 200 includes: the substrate 10; the LED element row including the LEDs 30 (semiconductor light-emitting elements) linearly aligned on the substrate 10; and the sealing member 40 which is formed linearly and collectively seals the LEDs 30 (LED element row).

Each of the LEDs 30 is a bare chip which emits monochromatic visible light, and is mounted on the substrate 10 through die bonding using a die attach material (a die bond material). In this exemplary embodiment, the LEDs 30 are blue LED chips which emit blue light when current is applied. As the blue LED chips, gallium nitride semiconductor light-emitting elements can be used, for example, each of which comprises an InGaN material and has a center wavelength of 440 nm to 470 nm.

Each of the LEDs 30 is electrically connected to the first line 21 and the second line 22 via a gold wire. More specifically, a p-side electrode and an n-side electrode for supplying current are formed on an upper surface of a chip of the LED 30, and the p-side electrode and the first line 21, and the n-side electrode and the second line 22 are connected through wire bonding using the gold wire.

It is to be noted that, in this exemplary embodiment, the LEDs 30 are arranged with the same pitch so that a distance between adjacent LEDs 30 of all of the LEDs 30 is the same. When the LEDs 30 are linearly mounted, light is likely to enter adjacent LEDs 30, resulting in possible color unevenness and luminance unevenness. However, the degree of color mixture can be uniformed even when light enters adjacent LEDs 30, by setting the same pitch between the LEDs 30 as described above, and thus it is possible to prevent the color unevenness and the luminance unevenness. In addition, the LEDs 30 may be connected in series, in parallel, or in combination of series connection and parallel connection, using the line 20, the gold wire, or the like.

[Sealing Member]

The sealing member 40 is a member for sealing the LEDs 30. The sealing member 40 according to this exemplary embodiment is linearly formed on the substrate 10 in the direction in which the elements of the LED element row are aligned, so as to collectively seal the LEDs 30 (LED element row). The sealing member 40 further includes a phosphor that is a light wavelength converter. The sealing member 40 configured as described above not only simply seals the LEDs 30 to protect the LEDs 30 but also converts a wavelength of light from the LEDs 30 into a predetermined wavelength (color conversion).

The sealing member 40 is formed to extend close to the both ends of the substrate 100 in the longitudinal direction. More specifically, the sealing member 40 is formed to extend from an end face of one of the short sides of the substrate 10 to an end face of the other short side opposite to the one of the short sides in a seamless manner. In addition, the sealing member 40 has a cross-section shape which is upwardly convex and is a substantially semicircular domical shape.

The sealing member 40 can be formed of an insulating resin material including a phosphor particle as the phosphor. As to the phosphor particles, when the LEDs 30 are blue LEDs, for example, phosphor particles which perform wavelength conversion to convert blue light into yellow light are used so as to convert light emitted from the sealing member 40 into white light. For example, YAG (yttrium, aluminum, garnet) yellow phosphor particles can be employed as the phosphor particles. With this configuration, part of the blue light emitted from the LEDs 30 is converted, through wavelength conversion, into yellow light by the yellow phosphor particle included in the sealing member 40. In other words, the yellow phosphor particles emit fluorescent light using blue light as excitation light. Then, blue light which is not absorbed (i.e., whose wavelength is not converted) by the yellow phosphor particle and yellow light whose wavelength is converted by the yellow phosphor particle are diffused and mixed in the sealing member 40, so that white light is emitted from the sealing member 40. It is to be noted that the sealing member 40 may include a light diffuse material such as silica.

In this exemplary embodiment, the sealing member 40 is a phosphor-containing resin including yellow phosphor particles evenly dispersed to a silicone resin. The sealing member 40 configured as described above can be formed through application using a dispenser. For example, a discharge nozzle of a dispenser is placed to face a predetermined position on the substrate 10, and the discharge nozzle is moved in an element aligned direction (the longitudinal direction of the substrate) while the sealing member material (phosphor-containing resin) is discharged from the discharge nozzle, so that the sealing member material is applied in a line form. It is to be noted that, after the sealing member material is applied, the sealing member material is hardened using a predetermined method. Thus the sealing member 40 can be formed.

Figure 3:
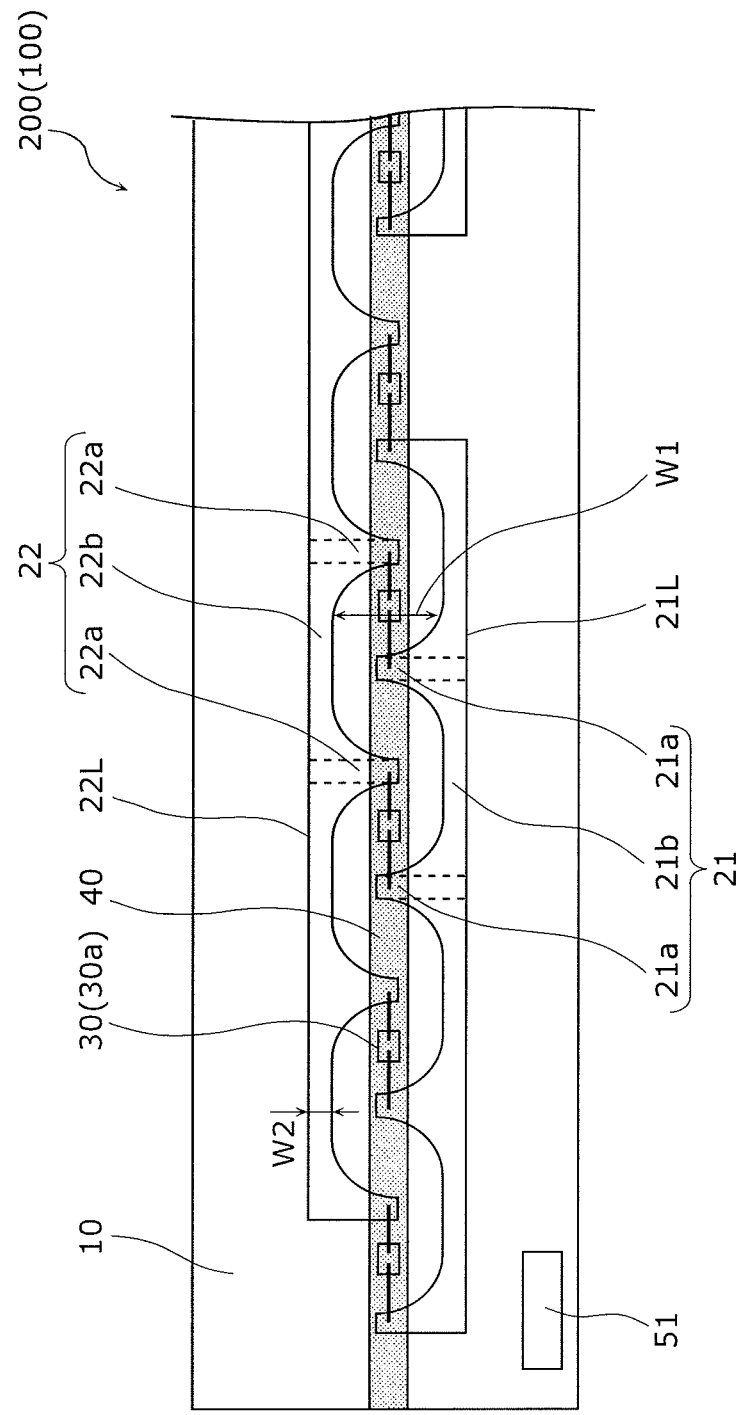
[FIG. 3]

Next, a characteristic configuration of the mounting board 100 and the light-emitting device 200 according to this exemplary embodiment will be described with reference to FIG. 3. FIG. 3 is a partially enlarged view of the light-emitting device according to Embodiment 1 of the present invention.

As described above, the line 20 includes the first line 21 and the second line 22 which are arranged to face each other across the LED element row of the LED 30.

As shown in FIG. 3, the first line 21 includes: a first main line portion 21b extending mainly in the row direction (element aligned direction) of the LED element row; and a first connecting portion 21a connected to the first main line portion 21b and having a portion for connecting to the LED 30. The first line 21 according to this exemplary embodiment includes a plurality of the first connecting portions 21a and the first main line portion 21b is formed to couple (interconnect) the adjacent first connecting portions 21a.

As with above, the second line 22 includes: a second main line portion 22b which extend mainly in the row direction (element aligned direction) of the LED element row; and a second connecting portion 22a connected to the second main line portion 22b and having a portion for connecting to the LED 30. The second line 22 according to this exemplary embodiment includes a plurality of the second connecting portions 22a and the second main line portion 22b is formed to couple (interconnect) the adjacent second connecting portions 22a. The first connecting portions 21a and the second connecting portions 22a each include a connecting portion (wire connecting portion) which is an auxiliary line to form a connecting portion to the LEDs 30 and is wired to one of the p-side electrode and the n-side electrode of the LED 30. For example, when focusing on one of the LEDs 30, the wire connecting portion of the first connecting portion 21a placed closest to the LED 30 and the p-side electrode of the LED 30 can be wired and the wire connecting portion of the second connecting portion 22a placed closest to the LED 30 and the n-side electrode of the LED 30 can be wired. It is to be noted that the entire surface of the substrate 10 is covered by a white resist or the like which has a high reflectance such that only the wire connecting portions of the first connecting portions 21a and the second connecting portions 22a are exposed.

Each of the first connecting portions 21a has a protruding portion formed to protrude toward the second line 22 in a region between adjacent ones of the LEDs 30 (interelement region) so as to form a portion (wire connecting portion) for connecting to a corresponding one of the LEDs 30. As with above, each of the second connecting portions 22a has a protruding portion formed to protrude toward the first line 21 in a region between adjacent ones of the LEDs 30 (interelement region) so as to form a portion (wire connecting portion) for connecting to a corresponding one of the LEDs 30.

It is to be noted that the protruding portions of the first connecting portions 21a of the first line 21 are formed to protrude toward the second main line portions 22b of the second line 22 according to this exemplary embodiment. Meanwhile, the protruding portions of the second connecting portions 22a of the second line 22 are formed to protrude toward the first main line portions 21b of the first line 21. In addition, the first connecting portions 21a and the second connecting portions 22a are each alternately disposed in the element aligned direction of the LEDs 30 according to this exemplary embodiment. More specifically, the protruding portions of the first connecting portions 21a and the protruding portions of the second connecting portions 22a are each formed to protrude alternately.

In addition, the first main line portions 21b and the second main line portions 22b are each a main line and each include a portion facing at least the LED 30 (LED mounting position 30a).

It is to be noted that, in this exemplary embodiment, the first line 21 includes a plurality of the first connecting portions 21a and a plurality of the main line portions 21b, and the first connecting portions 21a and the first main line portions 21b are each alternately disposed. In addition, the second line 22 includes a plurality of the second connecting portions 22a and a plurality of the second main line portions 22b, and the second connecting portions 22a and the second main line portions 22b are each alternately disposed.

In the mounting board 100 and the light-emitting device 200 according to this exemplary embodiment, a gap between the first main line portions 21b and the second main line portions 22b at the positions where the LEDs 30 are mounted (or the LED mounting positions 30a) is larger than a gap between the first main line portions 21b and the second main line portions 22b at the positions other than the positions where the LEDs 30 are mounted (or the LED mounting positions 30a). In other words, the first main line portions 21b and the second main line portions 22b are formed such that a gap between the first main line portions 21b and the second main line portions 22b at positions where positions on which the LEDs 30 are mounted (or the LED mounting positions 30a) are interposed than a gap between the first main line portions 21b and the second main line portions 22b at positions other than the positions on which the LEDs 30 are mounted (or the LED mounting positions 30a) are interposed.

According to this exemplary embodiment, the first line 21 and the second line 22 are formed such that a gap W1 between the first line 21 and the second line 22 changes between each of the protruding portions (wire connecting portions) of the first connecting portions 21a and a corresponding one of the protruding portions (wire connecting portions) of the second connecting portions 22a. More specifically, the gap between the first main line portions 21b and the second main line portions 22b changes such that, when measured at positions from the protruding portion of each of the first connecting portions 21a to the protruding portion of a corresponding one of the second connecting portions 22a, the gap is larger at the position where the LED 30 is mounted than at the position of the protruding portion of the first connecting portion 21a, and that the gap is smaller at the position of the protruding portion of the second connecting portion 22a than at position where the LED 30 is mounted.

In other words, between the protruding portion of the first connecting portion 21a and the protruding portion of the second connecting portion 22a, the gap between the first main line portion 21b and the second main line portion 22b becomes largest at the position where the LED 30 is mounted, increases gradually from one of the protruding portion of the first connecting portion 21a and the protruding portion of the second connecting portion 22a to the position where the LED 30 is mounted, and decreases gradually from the position where the LED 30 is mounted to the other of the protruding portion of the first connecting portion 21a and the protruding portion of the second connecting portion 22a.

In addition, according to this exemplary embodiment, a line width of each of the first main line portion 21b of the first line 21 is larger at a position close to the first connecting portion 21a than at a position facing the position where the LED 30 is mounted (the position of the line width W2). In addition, a line width of each of the second main line portion 22b of the second line 22 is larger at a position close to the second connecting portion 22a than at a position facing the position where the LED 30 is mounted. More specifically, an outline of each of the first main line portions 21b is formed to curve on the side facing the second line 22 (inward of the substrate 10) and an outline of each of the second main line portions 22b is formed to curve on the side facing the first line 21 (inward of the substrate 10), that is, the main line portions have outlines that curve on the side facing each other, and the main line portions of the first main line portions 21b and the second main line portions 22b each have a line width which is broader at ends than at the center in the element aligned direction. In this exemplary embodiment, the above-described configuration allows the gap W1 to be changed such that the gap W1 between the first line 21 and the second line 22 partially increases around the LED 30. It is to be noted that, in this exemplary embodiment, an outline 21L of the first line 21 on the side close to the longitudinal side (outer side) of the substrate 10 and an outline 22L of the second line 22 on the side close to the longitudinal side (outer side) of the substrate 10 are straight lines.

Next, a function effect of the mounting board 100 and the light-emitting device 200 according to this exemplary embodiment will be described with reference to FIG. 3 and FIG. 4. (a) in FIG. 4 is a partially enlarged view of a light-emitting device according to Comparison 1, and (b) in FIG. 4 is a partially enlarged view of a light-emitting device according to Comparison 2.

As described above, since LED modules are required to ensure an insulation distance, it is desired that two lines between which the LED element row is interposed are placed inwardly in the substrate as much as possible. Furthermore, it is desirable that the wiring resistance should be small. Accordingly, as shown in a light-emitting device 200A according to Comparison 1 illustrated in (a) in FIG. 4, it can be conceived that the line widths of a first line 21A and a second line 22A between which an element row of the LEDs 30 is interposed are increased to reduce the wiring resistance and the first line 21A and the second line 22A are placed inwardly in the substrate 10 to ensure the insulation distance.

Figure 4:
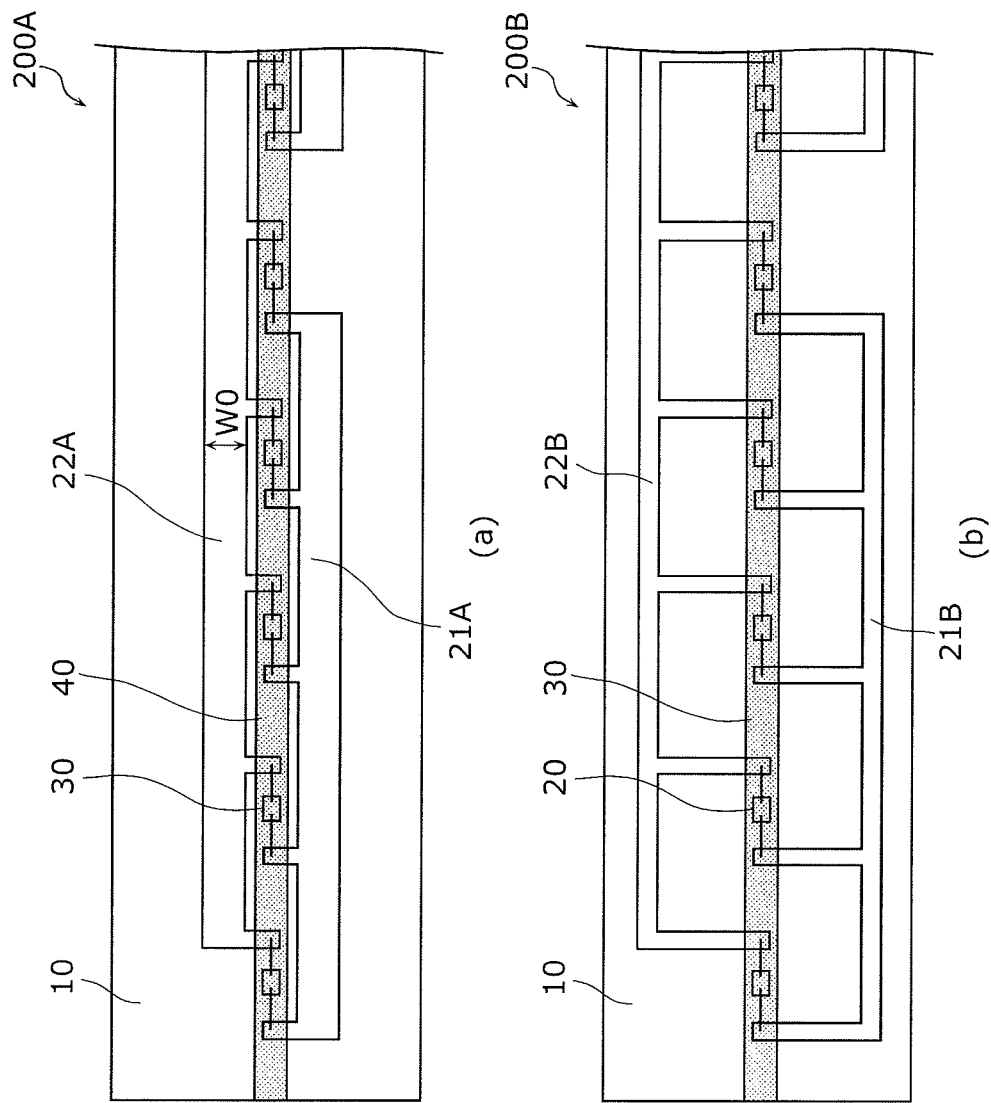
[FIG. 4] (a) in FIG. 4 is a partially enlarged view of the light-emitting device according to Comparison 1, and (b) in FIG. 4 is a partially enlarged view of the light-emitting device according to Comparison 2.

However, with the light-emitting device 200A according to Comparison 1 illustrated in (a) in FIG. 4, since the line widths of the first line 21A and the second line 22A are large, portions where light from the LEDs 30 are absorbed or reflected by the first line 21A and the second line 22A increase, leading to decrease in the light extraction efficiency. In particular, since the first line 21A and the second line 22A are placed inwardly in the substrate (in other words, the first line 21A and the second line 22A are placed close to the LEDs 30) in order to ensure the insulation distance in (a) in FIG. 4, light from the LEDs 30 is susceptible to the effect of absorption and reflection by the first line 21A and the second line 22A.

In particular, when a ceramic substrate is used as the substrate 10, light is likely to be affected by the first line 21A and the second line 22A. For example, when a ceramic substrate which comprises polycrystalline alumina formed by calcining an alumina particle to allow grain growth is used as the substrate 10, light from the LEDs 30 which entered the substrate 10 is diffused and reflected in the substrate 10 and is taken out to the outside of the substrate 10. Thus, when the first line 21 and the second line 22 are present around the LEDs 30, light which is to exit the substrate 10 to the outside is blocked by the first line 21 and the second line 22, resulting in decrease in the light extraction efficiency.

On the other hand, as shown in a light-emitting device 200B according to Comparison 2 illustrated in (b) in FIG. 4, it can be conceived that the line widths of the first line 21B and the second line 22B between which the element row of the LEDs 30 is interposed are reduced so as to avoid being affected by absorption and reflection caused by a first line 21B and a second line 22B and the first line 21B and the second line 22B are placed outwardly in the substrate 10.

However, with the light-emitting device 200B according to Comparison 2 as shown in (b) in FIG. 4, the wiring resistance of the first line 21B and the second line 22A increases as a result of narrowing the line width, and thus the forward voltage (Vf) of the LED increases. In addition, since the first line 21B and the second line 22A are each positioned close to an end of the substrate 10, the insulation distance cannot be sufficiently ensured.

As described above, with the conventional light-emitting devices, it is difficult, with a limited substrate area, to obtain both ensuring of the insulation distance and preventing decrease in the light extraction efficiency, while preventing increase in Vf. In particular, since the line has an elongate shape according to the elongate shape of the substrate, and not copper with low resistivity but silver having a relatively high resistance value is more likely to be used as a material for the line, the wiring resistance tends to be high even when the line has the same width as that in the conventional techniques. This makes it further difficult to obtain both of them. Furthermore, the line is formed through printing in many cases, and thus it is not easy to lower the resistivity by thickening the line.

In view of the above, in the mounting board 100 and the light-emitting device 200 according to this exemplary embodiment, the first main line portion 21b and the second main line portion 22b are formed such that the gap between the main line portions at positions where the LEDs 30 are interposed is larger than a gap between the main line portions at other positions as illustrated in FIG. 3.

With this configuration, even when the first line 21 and the second line 22 are placed inwardly in the substrate and close to the LED element row in order to ensure the insulation distance, it is possible to partially enlarge the gap W1 between the first line 21 and the second line 22 around the region on which the LEDs 30 are mounted (light emitting portion). With this configuration, it is possible to distance the first line 21 and the second line 22 from the LEDs 30 in the positions around the region (light emitting portion) on which the LEDs 30 are mounted. This allows preventing absorption of light from the LEDs 30 into the line 20 (the first line 21 and the second line 22) and reflection of light from the LEDs 30 off the line 20, and thus it is possible to prevent the light extraction efficiency from decreasing.

In addition, the first line 21 and the second line 22 according to this exemplary embodiment are formed such that, while the gap W1 between the first line 21 and the second line 22 is partially enlarged, the line width W2 of the main line of each of the first line 21 and the second line 22 is smaller than a line width W0 of each of the first line 21A and the second line 22A in the light-emitting device 200A of Comparison 1 shown in (a) in FIG. 4, so that the line width of each of the first line 21 and the second line 22 is partially reduced. This allows suppressing the effect of absorption and reflection of light caused by the line and thus reducing light loss compared to the light-emitting device 200A of Comparison 1 shown in (a) in FIG. 4, and thus it is possible to further prevent the light extraction efficiency from decreasing.

In addition, according to this exemplary embodiment, the first line 21 includes the first connecting portions 21a each having a larger line width than the line width (W2) of the main line at a position away from the LED 30, and the second line 22 includes the second connecting portions 22a each having a larger line width than the line width of the main line. More specifically, the first line 21 and the second line 22 include portions each having a partially wide line width provided discontinuously at a position away from the LED 30. With this configuration, it is possible to reduce the wiring resistance of each of the first line 21 and the second line 22 compared to the case where the first connecting portion 21a and the second connecting portion 22a are not present (in other words, the case where the line width is W2 and constant), so that it is possible to prevent increase in Vf of the LED 30.

As described above, with the mounting board 100 and the light-emitting device 200 according to this exemplary embodiment, it is possible to prevent increase in Vf as well as to ensure the insulation distance, while preventing decrease in the light extraction efficiency. With this configuration, it is possible to obtain both ensuring of the insulation distance and preventing decrease in the light extraction efficiency.

In particular, when a ceramic substrate is employed as the substrate 10, light which is to exit the substrate 10 to the outside is blocked by the first line 21 and the second line 22 as described above, and thus the light extraction efficiency is likely to decrease. In view of the above, as in this exemplary embodiment, the gap between the first line 21 and the second line 22 is partially enlarged around the LEDs 30 to distance the first line 21 and the second line 22 away from the LEDs 30, thereby allowing preventing light which is to exit the substrate 10 (ceramic substrate) to the outside from being blocked by the first line 21 and the second line 22.

In addition, the present invention is also effective when a substrate which is formed such that light from the LEDs 30 cannot enter the inside is employed as the substrate 10.

For example, as the substrate 10 as described above, a resin substrate can be employed which has a surface on which a line 20 which comprises copper (copper line) is formed and which is covered entirely by a white resist to cover the line 20. In this case, the white resist portion has higher reflectance directly above the substrate 10 than reflectance above the line 20. In view of the above, according to this exemplary embodiment, the gap between the first line 21 and the second line 22 is partially enlarged around the LEDs 30 to distance the first line 21 and the second line 22 away from the LEDs 30, and thus it is possible to ensure a portion having high reflectance around each of the LEDs 30.

In addition, a metal substrate may be employed which has an upper surface covered by an insulating film, as the substrate 10 which does not allow light to enter inside. In this case as well, the gap between the first line 21 and the second line 22 is partially enlarged around the LEDs 30, and thus it is possible to ensure a portion having high reflectance around each of the LEDs 30.

In addition, as shown in FIG. 3, the protruding portions of the first connecting portions 21a of the first line 21 and the protruding portions of the second connecting portions 22a of the second line 22 are each alternately disposed in the element aligned direction of the LED element row according to this exemplary embodiment. In addition, the wire connecting portions of the first connecting portions 21a and the wire connecting portions of the second connecting portions 22a are arranged to face each other in the element aligned direction.

With this configuration, gold wires which connect the first connecting portions 21a, the second connecting portions 22a, and the LEDs 30 can be wire bonded along the element aligned direction of the LED element row (the linearly extending direction of the sealing member 40). Accordingly, it is possible to reduce the restriction which the sealing member 40 receives from the gold wires (the fact that the sealing member 40 is pulled by the gold wires) when the sealing member 40 is applied to the substrate 10 in the longitudinal direction, and thus the sealing member 40 can be applied into a desired shape.

[Embodiment 2]

Figure 5:
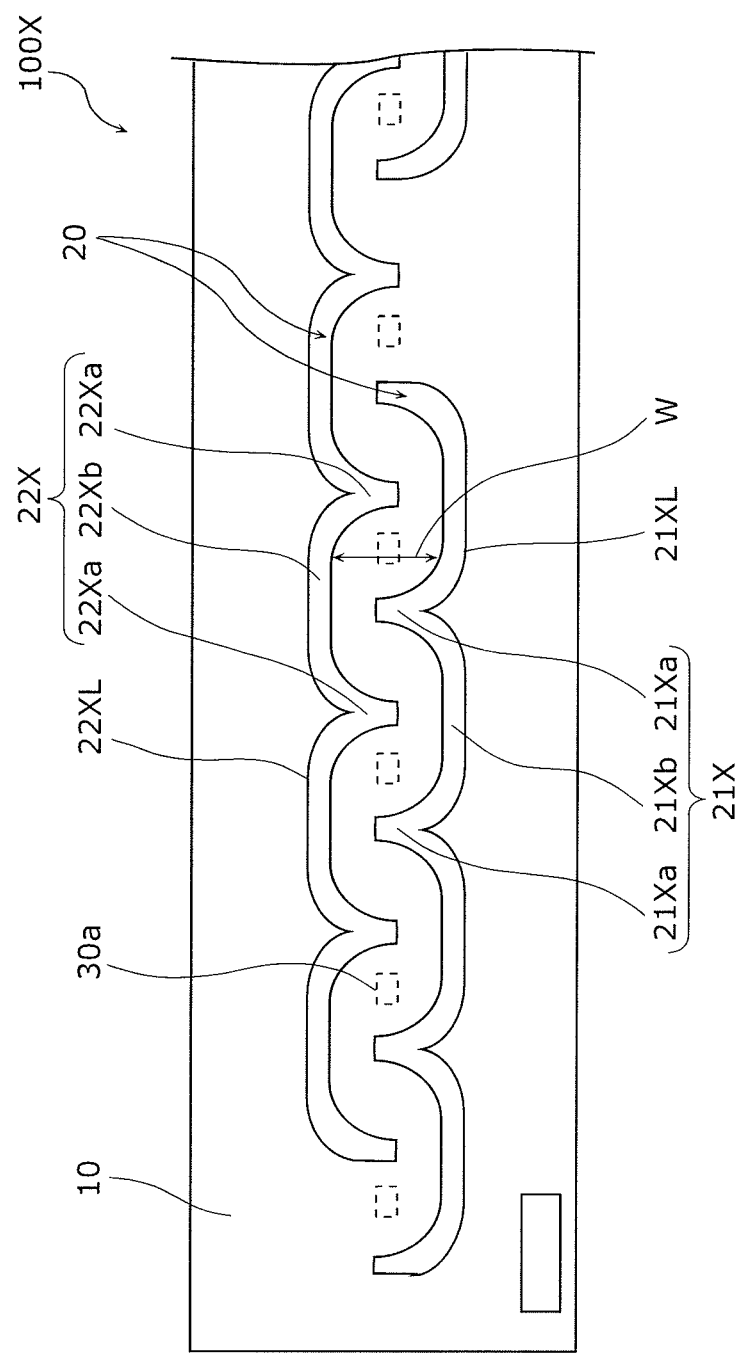
[FIG. 5]

Next, a mounting board 100X and a light-emitting device according to Embodiment 2 of the present invention will be described with reference to FIG. 5. FIG. 5 is a partially enlarged view of a mounting board according to Embodiment 2 of the present invention.

The basic configurations of the mounting board 100X and the light-emitting device according to this exemplary embodiment are the same as those of the mounting board 100 and the light-emitting device 200 according to Embodiment 1, and therefore the following describes mainly the difference between them. It is to be noted that, in this exemplary embodiment, the same elements as those in Embodiment 1 are assigned with the same reference signs, and detailed description is omitted or simplified. In addition, in the light-emitting device according to this exemplary embodiment, the mounting board 100X illustrated in FIG. 5 is employed.

As with Embodiment 1, the line 20 includes a first line 21X and a second line 22X which are arranged to face each other across the LED element row of the LEDs 30 in the mounting board 100X and the light-emitting device according to this exemplary embodiment.

As shown in FIG. 5, the first line 21X according to this exemplary embodiment includes: a first main line portion 21Xb which extends mainly in the row direction (element aligned direction) of the LED element row; and a first connecting portion 21Xa connected to the first main line portion 21Xb and having a portion for connecting to the LEDs 30, as with the first line 21 according to Embodiment 1. The first line 21X includes a plurality of the first connecting portions 21Xa and the first main line portion 21Xb is formed to couple (interconnect) the adjacent first connecting portions 22Xa.

In the same manner as above, the second line 22X includes: a second main line portion 22Xb which extends mainly in the row direction (element aligned direction) of the LED element row; and a second connecting portion 22Xa connected to the second main line portion 22Xb and having a portion for connecting to the LEDs 30. The second line 22X includes a plurality of the second connecting portions 22Xa and the second main line portion 22Xb is formed to couple (interconnect) the adjacent second connecting portions 22Xa.

The first connecting portions 21xa and the second connecting portions 22Xa each include a connecting portion (wire connecting portion) which is an auxiliary line to form a connecting portion to a corresponding one of the LEDs 30 and is wired to one of the p-side electrode and the n-side electrode of the LED 30.

In addition, each of the first connecting portions 21Xa is formed to protrude toward the second line 22X in a region between adjacent ones of the LEDs 30 (interelement region) so as to form a portion (wire connecting portion) for connecting to a corresponding one of the LEDs 30. In the same manner as above, each of the second connecting portions 22Xa is formed to protrude toward the first line 21X in a region between adjacent ones of the LEDs 30 (interelement region) so as to form a portion (wire connecting portion) for connecting to a corresponding one of the LEDs 30. The first connecting portions 21Xa and the second connecting portions 22Xa are each alternately disposed in the element aligned direction of the LEDs 30.

In this exemplary embodiment as well, the first main line portions 21Xb and the second main line portions 22Xb are each formed such that an inner outline curves on the substrate 10, and a gap between the first main line portions 21Xb and the second main line portions 22Xb at the positions where the LEDs 30 are mounted (or the LED mounting positions 30a) is larger than a gap between the first main line portions 21Xb and the second main line portions 22Xb at the positions other than the positions where the LEDs 30 are mounted (or the LED mounting positions 30a). More specifically, the gap W1 between the first line 21X and the second line 22X changes between the protruding portions of the first connecting portions 21Xa and the protruding portions of the second connecting portions 22Xa such that the gap W1 at the positions where the LEDs 30 are mounted is larger than the gap W1 at the positions where the protruding portions of the first connecting portions 21Xa are disposed, and the gap W1 at the positions where the protruding portions of the first connecting portions 22Xa are disposed is larger than the gap W1 at the positions where the LEDs 30 are mounted, when W1 is measured at positions from the protruding portions of the first connecting portions 21Xa to the protruding portions of the second connecting portions 22Xa.

However, the wiring patterns of the first line 21X and the second lines 22X according to this exemplary embodiment are different from the wiring patterns of the first line 21 and the second lines 22 according to Embodiment 1. According to this exemplary embodiment, the line width is substantially constant in each of the first line 21X and the second line 22X. In other words, in this exemplary embodiment, each of the first main line portions 21Xb of the first line 21X and each of the second main line portions 22Xb of the second line 22X do not have a width which is wider at ends than at the center portion.

More specifically, the outline 21L of the first line 21 on the side close to the longitudinal side (outside) of the substrate 10 and the outline 22L of the second line 22 on the side close to the longitudinal side (outside) of the substrate 10 are straight lines in Embodiment 1 described above. However, an outline 21XL of the first connecting portion 21Xa on the side close to the longitudinal side of the substrate 10 is recessed toward a top end of the first connecting portions 21Xa according to this exemplary embodiment. In addition, an outline 22XL of the second connecting portion 22Xa on the side close to the longitudinal side of the substrate 10 is recessed toward a top end of the second connecting portions 22Xa according to this exemplary embodiment.

Although not illustrated, the light-emitting device according to this exemplary embodiment can be configured by mounting the LEDs 30 at the respective LED mounting positions 30a on the substrate 10 shown in FIG. 5 and collectively sealing the LEDs 30 by the sealing member 40 in the same manner as Embodiment 1.

In the mounting board 100X and the light-emitting device which employs the mounting board 100X as described above, the first main line portions 21Xb and the second main line portions 22Xb are formed such that the gap at each of the positions where the LEDs 30 are interposed is larger than the gap at the other positions, and the first line 21X and the second line 22X are formed such that the gap W1 between the first line 21X and the second line 22X increases from the protruding portions of the first connecting portions 21Xa to the protruding portions of the second connecting portions 22Xa to be largest at the positions where the LEDs 30 are disposed when W1 is measured at positions from the protruding portions of the first connecting portions 21Xa and the protruding portions of the second connecting portions 22Xa.

With this configuration, even when the first line 21X and the second line 22X are placed inwardly in the substrate 10 and close to the LED element row in order to ensure the insulation distance, it is possible to partially enlarge the gap W1 between the first line 21X and the second line 22X around the regions in which the LEDs 30 are mounted (light emitting portion). With this configuration, it is possible to distance the first line 21X and the second line 22X from the LEDs 30 in the positions around the regions (light emitting portion) in which the LEDs 30 are mounted. This allows suppressing absorption of light from the LEDs 30 into the line 20 (the first line 21X and the second line 22X) and reflection of light from the LEDs 30 off the line 20, and thus it is possible to suppress the light extraction efficiency from decreasing.

Thus, with the mounting board 100X and the light-emitting device according to this exemplary embodiment as well, it is possible to obtain both suppressing increase in Vf and ensuring of the insulation distance, while suppressing decrease in the light extraction efficiency.

It is to be noted that, the protruding portions of the first connecting portions 21Xa of the first line 21X and the protruding portions of the second connecting portions 22Xa of the second line 22X are arranged to face each other in the element aligned direction of the LEDs 30 according to this exemplary embodiment as well. With this configuration, since the gold wires can be wire bonded along the linearly extending direction of the sealing member 40, it is possible to easily apply the sealing member 40.

[Embodiment 3]

Next, a mounting board 100Y and a light-emitting device 200Y according to Embodiment 3 of the present invention will be described with reference to FIG. 6. (a) in FIG. 6 is a partially enlarged view of a mounting board according to Embodiment 3 of the present invention, and (b) in FIG. 6 is a partially enlarged view of a light-emitting device according to Embodiment 3 of the present invention.

The basic configurations of the mounting board 100Y and the light-emitting device 200Y according to this exemplary embodiment are the same as those of the mounting board 100 and the light-emitting device 200 according to Embodiment 1, and therefore the following describes mainly the difference between them. It is to be noted that, in this exemplary embodiment, the same elements as those in Embodiment 1 are assigned with the same reference signs, and detailed description is omitted or simplified.

Figure 6:
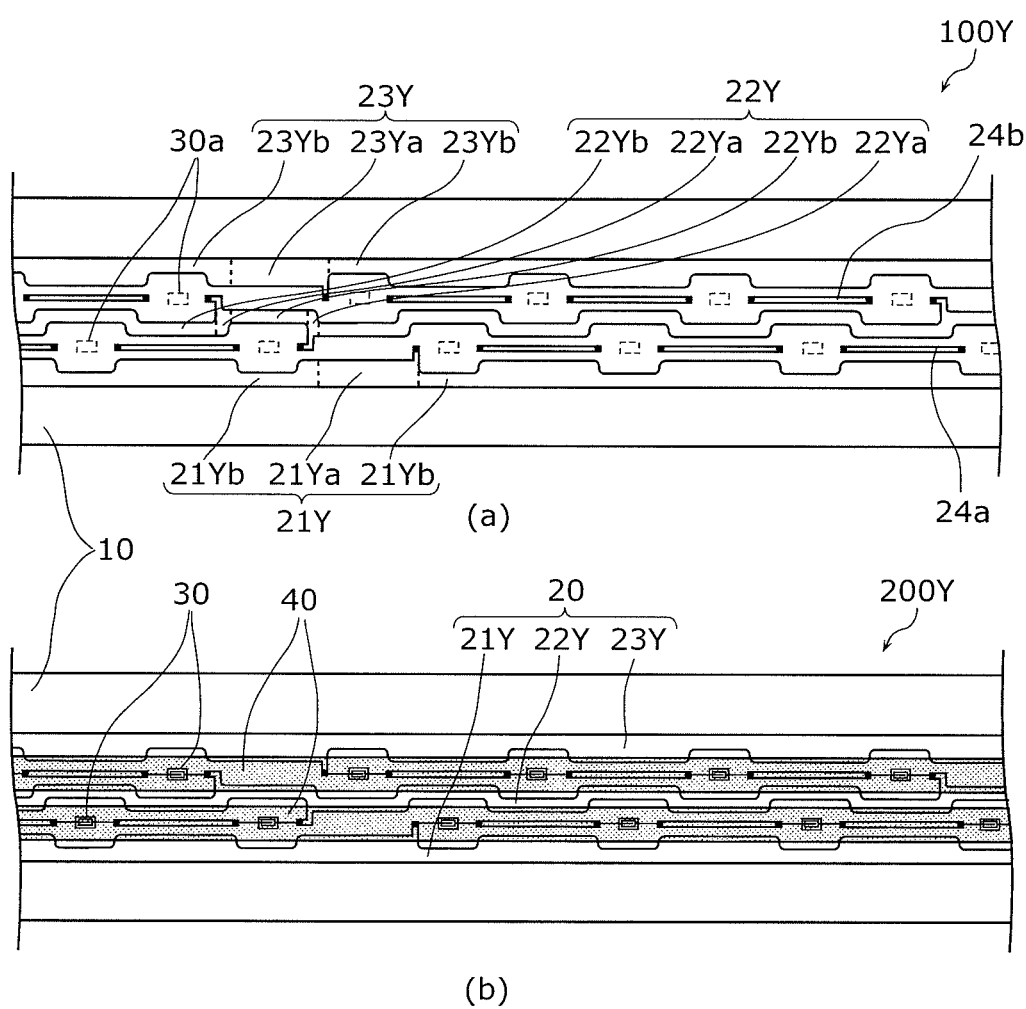
[FIG. 6] (a) in FIG. 6 is a partially enlarged view of a mounting board according to Embodiment 3 of the present invention, and (b) in FIG. 6 is a partially enlarged view of a light-emitting device according to Embodiment 3 of the present invention.

The LED mounting positions 30a are provided in a single line in the mounting board 100 according to Embodiment 1 shown in FIG. 1, however, the LED mounting positions 30a are provided in two lines in the mounting board 100Y according to this exemplary embodiment as shown in (a) in FIG. 6. More specifically, in the light-emitting device 200Y, LED element rows are provided in two lines, that is, a first element row and a second element row, as shown in (b) in FIG. 6. Each of the first element row and the second element row is formed by linearly aligning a plurality of LEDs 30. According to this exemplary embodiment, the LEDs 30 in the first element row (LED mounting positions 30a) and the LEDs 30 in the second element row (LED mounting positions 30a) are mounted alternately (in a staggered manner) to avoid facing each other.

As shown in (b) in FIG. 6, each of the sealing members 40 is linearly formed on the substrate 10 to collectively seal the LEDs 30 in a corresponding one of the first element row and the second element row. In other words, two sealing members 40 are formed according to this exemplary embodiment.

The line 20 according to this exemplary embodiment includes a first line 21Y, a second line 22Y, and a third line 23Y. The first line 21Y, the second line 22Y, and the third line 23Y extend in the longitudinal direction of the substrate 10 such that the second line 22 is interposed between the first line 21Y and the third line 23Y.

More specifically, the first line 21Y and the second line 22Y are arranged to face each other with the first element row interposed therebetween in the longitudinal direction of the substrate 10 along the element aligned direction of the first element row. In addition, the second line 22Y and the third line 23Y are arranged to face each other with the second element row interposed therebetween in the longitudinal direction of the substrate 10 along the element aligned direction of the second element row. As described above, the second line 22Y disposed in the middle among three lines of the first line 21Y, the second line 22Y, and the third line 23Y, is a line which interposes the first element row as well as the second element row, and a common line which supplies power to the LEDs 30 in both of the first element row and the second element row.

The first line 21Y includes: first main line portions 21Yb extending mainly in the row direction (element aligned direction) of the first element row; and first connecting portions 21Ya connected to the first main line portions 21Yb and having portions for connecting to the LEDs 30.

The first connecting portions 21Ya of the first line 21Y are each formed between adjacent ones of the first main line portions 21Yb. The first connecting portions 21Ya each have a protruding portion formed to protrude toward the second line 22 in a region between adjacent ones of the LED mounting positions 30a (LEDs 30) in the first element row, such that the first connecting portions 21Ya each have a portion for connecting to a corresponding one of the LEDs 30 (wire connecting portion). The first connecting portions 21Ya are formed to face the second main line portions 22Yb of the second line 22Y.

The first main line portions 21Yb of the first line 21Y are main lines and have portions which face at least the LEDs 30 (LED mounting positions 30a) in the first element row.

The second line 22Y includes: second main line portions 22Yb extending mainly in the row direction (element aligned direction) of the first element row; and second connecting portions 22Ya connected to the second main line portions 22Yb and having portions for connecting to the LEDs 30.

The second connecting portions 22Ya of the second line 22Y are each formed between adjacent ones of the first main line portions 22Yb. The second connecting portions 22Ya each have a protruding portion formed to protrude toward the first line 21 or the third line in a region between adjacent ones of the LED mounting positions 30a (LEDs 30) in the first element row or the second element row such that the second connecting portions 22Ya each have a portion for connecting to a corresponding one of the LEDs 30 in the first element row or the second element row. The second connecting portions 22Ya are formed to face the second main line portions 22Yb of the first line 21Y or the third main line portions of the third line 23Y.

The second main line portions 22Yb of the second line 22Y are main lines and have portions which face at least the LEDs 30 (LED mounting positions 30a) in at least one of the first element row and the second element row.

In addition, the second line 22Y according to this exemplary embodiment is formed to alternately protrude in a region between adjacent LED mounting positions 30a (LEDs 30) in the first element row and in a region between adjacent LED mounting positions 30a (LEDs 30) in the second element row. As described above, the second line 22Y is formed to be distanced from each of the LEDs 30 (LED mounting positions 30a) in the first element row and the second element row which are disposed in a staggered manner, and according to the exemplary embodiment, the second line 22Y includes consecutive ones of the second main line portions 22Yb including one protruding toward the first element row (toward first line 21Y) and the other protruding toward the second element row (toward third line 23Y).

The third line 23Y includes: third main line portions 23Yb extending mainly in the row direction (element aligned direction) of the second element row; and third connecting portions 23Ya connected to the third main line portions 23Yb and having portions for connecting to the LEDs 30.

The third connecting portions 23Ya of the third line 23Y are each formed between adjacent ones of the third main line portions 23Yb. The third connecting portions 23Ya each have a protruding portion formed to protrude toward the second line 22 in a region between adjacent ones of the LED mounting positions 30a (LEDs 30) in the second element row, such that the third connecting portions 23Ya each have a portion for connecting to a corresponding one of the LEDs 30 (wire connecting portion). The third connecting portions 23Ya are formed to face the third main line portions 23Yb of the third line 23Y.

The third main line portions 23Yb of the third line 23Y are main lines and have portions which face at least the LEDs 30 (LED mounting positions 30a) in the second element row.

In the mounting board 100Y and the light-emitting device 200Y according to this exemplary embodiment, a gap between the first main line portions 21Yb and the second main line portions 22Yb at positions where the LEDs 30 are mounted in the first element row (or the LED mounting positions 30a) is larger than a gap between the first main line portions 21Yb and the second main line portions 22Yb at positions other than the positions where the LEDs 30 are mounted in the first element row (or the LED mounting positions 30a).

In addition, the mounting board 100Y and the light-emitting device 200Y according to this exemplary embodiment, a gap between the third main line portions 23Yb and the second main line portions 22Yb at positions where the LEDs 30 are mounted in the second element row (or the LED mounting positions 30a) is larger than a gap between the third main line portions 23Yb and the second main line portions 22Yb at positions other than the positions where the LEDs 30 are mounted in the second element row (or the LED mounting positions 30a).

Furthermore, according to this exemplary embodiment, an outline of each of the first main line portions 21Yb on the side facing the second line 22Y (inward of the substrate 10) and an outline of each of the third main line portions 23Yb on the side facing the second line 22Y (inward of the substrate 10) have steps, and the first main line portions 21Yb and the third main line portions 23Yb each have a wide portion having a wide line width and a narrow portion having a narrow line width. With this configuration, it is possible to partially enlarge the gap between the first line 21Y and the second line 22Y around the LEDs 30 as well as partially enlarge the gap between the third line 23Y and the second line 22Y around the LEDs 30.

It is to be noted that, the outline of the first line 21Y on the side close to the longitudinal side (outside) of the substrate 10 and the outline of the third line 23Y on the side close to the longitudinal side (outside) of the substrate 10 are straight lines.

Furthermore, the line 20 further includes auxiliary lines 24a and 24b according to this exemplary embodiment. The auxiliary lines 24a are disposed to connect the LEDs 30 in the first element row in series and/or in parallel. The auxiliary lines 24b are disposed to connect the LEDs 30 in the second element row in series and/or in parallel. The auxiliary lines 24a and 24b are made of the same material as that of which the first line 21Y, the second line 22Y, and the third line 23Y are made, and are patterned into a predetermined shape at the same time these three lines are patterned. It is to be noted that, in FIG. 6, end portions (blackened portion) of the line 20 each represents an exposed portion of the connecting portion (wire connecting portion) wired to one of the p-side electrode and the n-side electrode of a corresponding one of the LEDs 30, and regions other than the wire connecting portion are each covered with a glass coating film.

In addition, three lines (the first line 21Y, the second line 22Y, and the third line 23Y) are capable of, for example, supplying a positive voltage to the first line 21Y and the third line 23Y and a negative voltage to the second line 22Y. Alternatively, the first line 21Y and the third line 23Y may be supplied of a negative voltage and the second line 22Y may be supplied of a positive voltage.

In addition, two element rows, that is, the first element row and the second element row may be configured such that the two element rows are connected in parallel to emit light at the same time, or the two element rows are independently driven to individually emit light. In this case, the LEDs 30 may all have the same color temperature in the first element row and the second element row, or may have the color temperature different between the arrays. It is to be noted that, when two element rows are driven independently, it is preferable that the second line 22Y be further divided into two lines; that is, the second line 22Y for driving the first element row and the second line 22Y for driving the second element row.

In the mounting board 100Y and the light-emitting device 200Y according to this exemplary embodiment described above, the first main line portions 21Yb and the second main line portions 22Yb in the first element row are formed such that the gap at the positions where the LEDs 30 are interposed is larger than the gap in other positions. In addition, the third main line portions 23Yb and the second main line portions 22Yb in the second element row are formed such that the gap at the positions where the LEDs 30 are interposed is larger than the gap in other positions.

With this configuration, it is possible to partially enlarge the gap between the first line 21Y and the second line 22Y and the gap between the third line 23Y and the second line 22Y around the region (light emitting portion) on which the LEDs 30 are mounted even when the first line 21Y and the third line 23Y are placed inwardly in the substrate 10 and the first line 21Y, the second line 22Y, and the third line 23Y are positioned close to the element row in order to ensure the insulation distance. With this configuration, it is possible to distance part of the first line 21Y and part of the second line 22Y from the LEDs 30 around the region (light emitting portion) on which the LEDs 30 are mounted. This allows suppressing absorption of light from the LEDs 30 into the line 20 (the first line 21Y, the second line 22Y, and the third line 23Y) and reflection of light from the LEDs 30 off the line 20, and thus it is possible to suppress the light extraction efficiency from decreasing.

Thus, with the mounting board 100Y and the light-emitting device 200Y according to this exemplary embodiment as well, it is possible to obtain both ensuring of the insulation distance and suppressing decrease in the light extraction efficiency, while suppressing the increase in Vf.

In addition, according to this exemplary embodiment, the LEDs 30 (the LED mounting positions 30a) in the first element row and the LEDs 30 (the LED mounting positions 30a) in the second element row are mounted alternately so as to avoid facing each other, and the second line 22Y interposed between the first line 21Y and the third line 23Y is formed to protrude alternately toward the first line 21Y and toward the third line 23Y to have a wavy shape. More specifically, in the second line 22Y, the second main line portions 22Yb which protrude toward the first line 21Y and the second main line portions 22Yb which protrude toward the third line 23Y are alternately protrude in opposite directions.

With this configuration, even when three lines (the first line 21Y, the second line 22Y, and the third line 23Y) are disposed by aligning two element rows on the substrate 10 that has a narrow width and an elongate shape, it is possible to suppress the light extraction efficiency from decreasing because the three lines can be distanced from the LEDs 30 around the region (light emitting portion) in which the LEDs 30 are mounted. As described above, it is possible to ensure the insulation distance and suppress decrease in the light extraction efficiency, while suppressing increase in a voltage even when it is necessary to form the line 20 including a plurality of lines in a small space.

It is to be noted that, three lines are disposed in two element rows according to this exemplary embodiment; however, the numbers are not limited to these numbers. For example, the element row may be composed of n arrays where n is larger than or equal to three. In this case, the line 20 may be composed of n+1 lines, for example.

[Embodiment 4]

Figure 7:
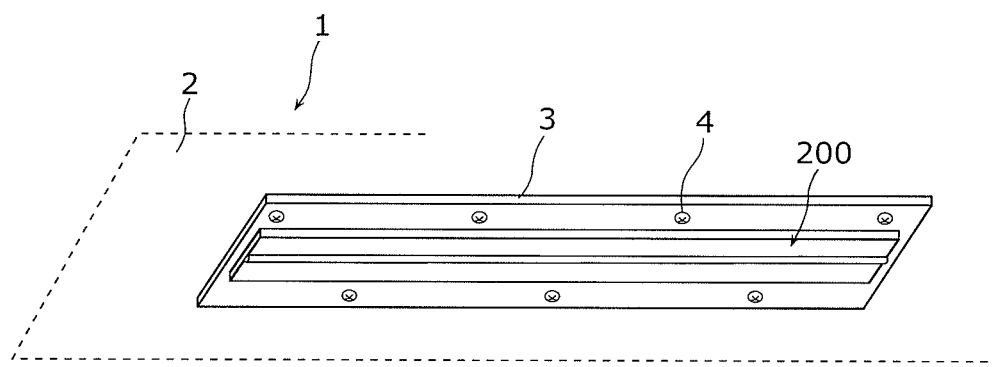
[FIG. 7]

Next, Embodiment 4 according to the present invention will be described with reference to FIG. 7. FIG. 7 is a perspective overview of a lighting apparatus according to Embodiment 4 of the present invention. This exemplary embodiment is an example in which the light-emitting device 200 according to above-described Embodiment 1 is applied to a lighting apparatus. It is to be noted that, in this exemplary embodiment, the light-emitting device according to above-described Embodiments 2 and 3 may be employed.

As shown in FIG. 7, a lighting apparatus 1 according to this exemplary embodiment is a lighting apparatus of a base light type and includes: the light-emitting device 200; lighting equipment 2; and a mounting member 3 for mounting the lighting equipment 2 and the light-emitting device 200. The light-emitting device 200 is directly mounted, together with the mounting member 3, on the lighting equipment 2.

The lighting equipment 2 includes a lighting circuit or the like for controlling lighting of the light-emitting device 200. In addition, the lighting equipment 2 has screw holes disposed to correspond to through-holes of the mounting member 3. This means that a position of each of the through-holes of the mounting member 3 corresponds to a position of a corresponding one of the screw holes of the lighting equipment 2. The lighting equipment 2 can be shaped by, for example, pressing an aluminized plate and is directly mounted on a ceiling or the like.

The mounting member 3 is a substrate having an elongate shape, and a metal base substrate made of, for example, an aluminum substrate having an elongate shape can be used as the mounting member 3. The mounting member 3 is provided with the through-holes. When the mounting member 3 and the lighting equipment 2 are to be fixed, the through-holes of the mounting member 3 and the screw holes of the lighting equipment 2 are matched, and screws 4 are inserted into the through-holes to connect the screws 4, the through-holes, and the screw holes.

In this exemplary embodiment, the through-holes are provided on the mounting member 3 to be positioned alternately on the longitudinal sides which are opposite to each other. For example, as shown in FIG. 7, through-holes may be provided such that four through-holes are provided on one longitudinal side of the mounting member 3, and three through-holes are provided on the other longitudinal side in such a manner that the through-holes do not face each other. The method of fixing the mounting member 3 and the light-emitting device 200 is not particularly limited; however, the mounting member 3 and the light-emitting device 200 are fixed using adhesives, for example.

Figure 8A:
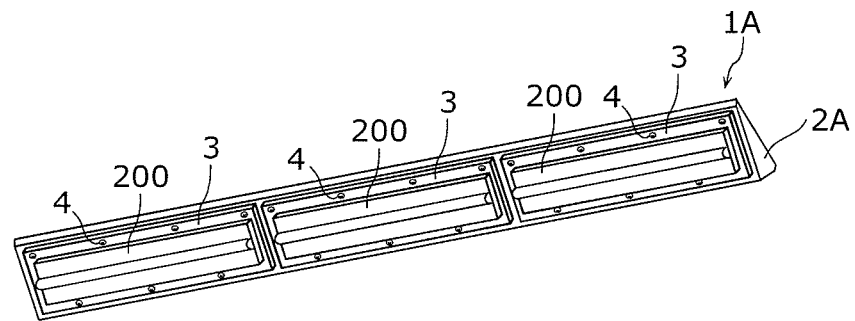
[FIG. 8A]
Figure 8B:
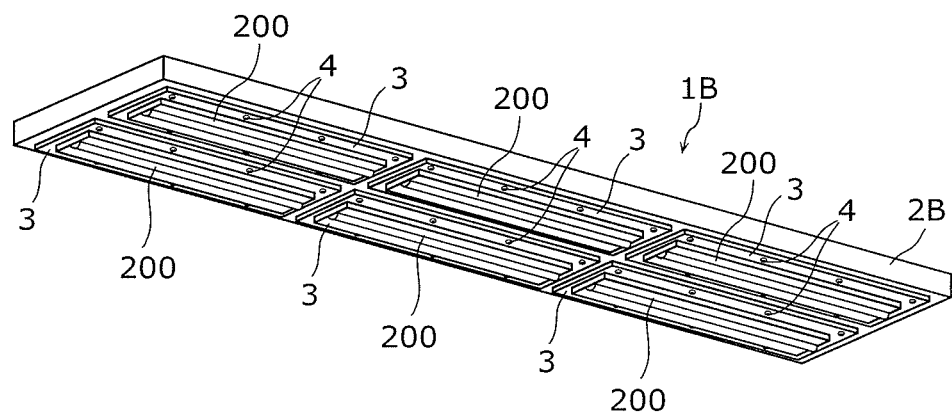
[FIG. 8B]
Figure 8C:
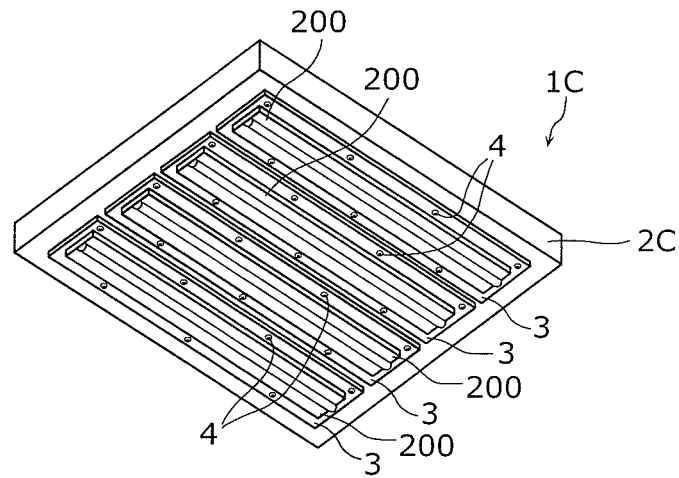
[FIG. 8C]

Here, a specific example of the lighting apparatus according to this exemplary embodiment will be described with reference to FIG. 8A to FIG. 8C. FIG. 8A to FIG. 8C are diagrams illustrating a first to a third specific examples of the lighting apparatus according to Embodiment 4 of the present invention.

The lighting apparatus 1A shown in FIG. 8A is a lighting apparatus in which three light-emitting devices 200 are mounted on each of two tilted surfaces of a lighting equipment 2A having a triangle shape. In addition, a lighting apparatus 1B shown in FIG. 8B is a lighting apparatus in which six light-emitting devices 200 are mounted on a surface of a lighting equipment 2B having a rectangle shape in a plan view. Furthermore, a lighting apparatus 1C shown in FIG. 8C is a lighting apparatus in which four light-emitting devices 200 are mounted on a lighting equipment 2B having a square shape in a plan view.

It is to be noted that the number of the light-emitting devices 200 mounted on the lighting equipment in each of the lighting apparatus 1A to 1C is an example, and not limited to the above-described numbers. In addition, the light-emitting devices 200 can be mounted using, for example, the above-described mounting member 3 as shown in each of the diagrams.

Although not illustrated, a transparent cover may be provided to cover the light-emitting devices 200 in each of the lighting apparatus 1A to 1C. Furthermore, a single mounting member 3 is used for a single light-emitting device 200, however, it is not always the case. For example, a plurality of the light-emitting devices 200 may be fixed to a single mounting member 3. In addition, the through-holes of the mounting member 3 are provided on the longitudinal sides of the substrate according to this exemplary embodiment, however, the through-holes may be provided on only one of the longitudinal sides (only on one side). In addition, the screw holes are formed by providing through-holes on the mounting member 3 according to this exemplary embodiment, however, notches may be used for inserting the screws 4 instead of the through-holes. For example, it is possible to provide semi-circular notches on the longitudinal sides of the mounting member 3, and the notches can be used for screw fixation. In addition, a standardized member may be used as the mounting member 3.

[Modification of Embodiment 4]

Figure 9:
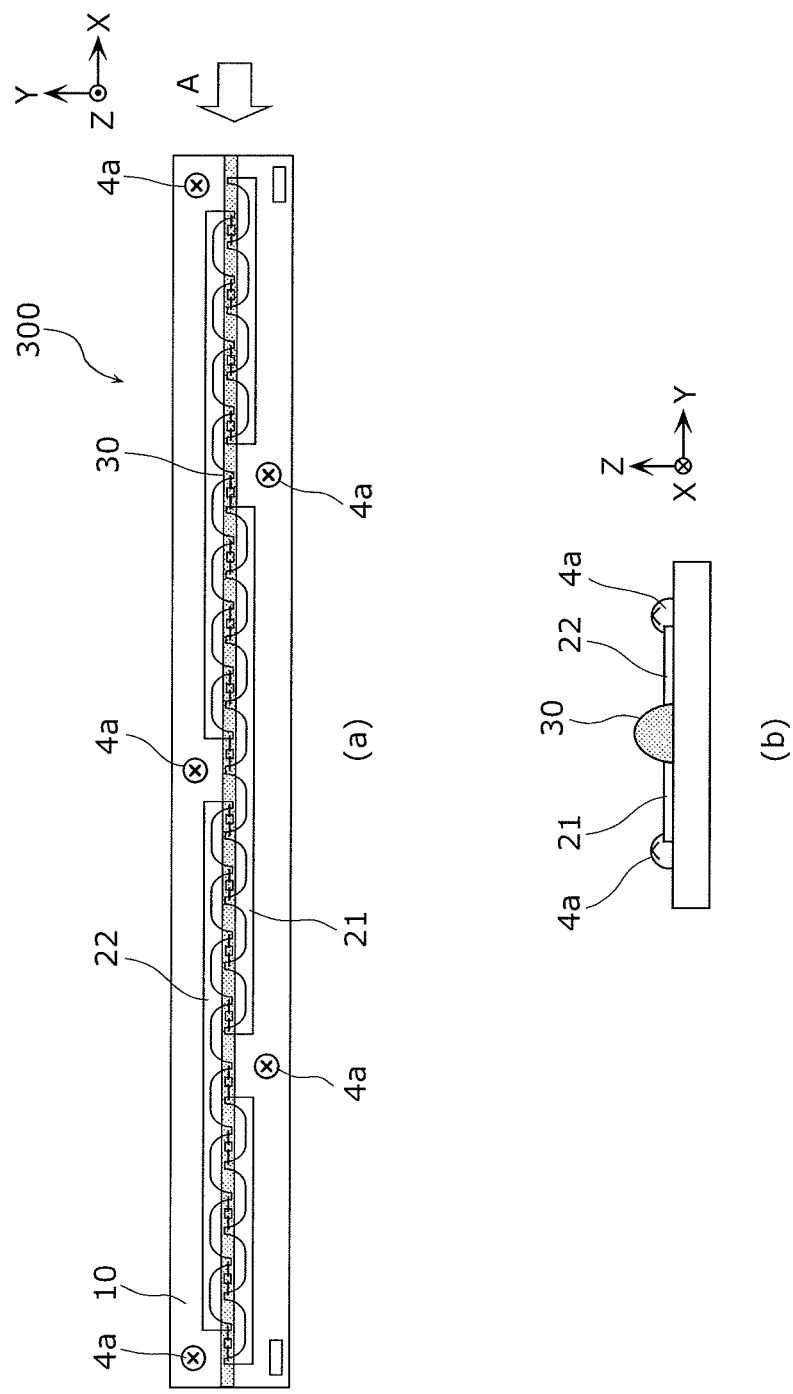
[FIG. 9] (a) in FIG. 9 is a plan view illustrating a configuration of a modification of the light-emitting device used in the lighting apparatus according to Embodiment 4 of the present invention, and (b) in FIG. 9 is a side view of the light-emitting device.

Next, a modification of Embodiment 4 according to the present invention will be described with reference to FIG. 9. (a) in FIG. 9 is a plan view illustrating a configuration of a modification of the light-emitting device used in the lighting apparatus according to Embodiment 4 of the present invention, and (b) in FIG. 9 is a side view of the light-emitting device when viewed in the direction indicated by an arrow A. FIG. 9 illustrates the light-emitting device which is mounted on a lighting equipment (being fixed by screws). It is to be noted that the basic configuration of the light-emitting device 300 according to this Modification is the same as that of the light-emitting device 200 according to Embodiment 1, and therefore the following describes mainly the difference between them. In addition, in this Modification, the same structural elements as those in Embodiment 1 are assigned with the same reference signs, and detailed description is omitted or simplified.

This Modification is an example in which the substrate 10 of the light-emitting device 300 is used as the mounting member 3 in FIG. 7. More specifically, in this Modification, the substrate 10 serves also as a mounting member, and the light-emitting device 300 is mounted on the lighting equipment 2 by directly fixing the substrate 10 to the lighting equipment 2.

Accordingly, in this Modification, through-holes for mounting are provided on the substrate 10, and when the light-emitting device 300 and the lighting equipment 2 are to be fixed, the through-holes of the substrate 10 and the screw holes of the lighting equipment 2 are matched, and screws 4a are inserted into the through-holes to thread the screws 4, the through-holes, and the screw holes.

The through-holes of the substrate 10 are provided alternately on the respective longitudinal sides which are opposite to each other, and in this Modification as shown in (a) in FIG. 9, three through-holes are provided on one longitudinal side of the substrate 10 and two through-holes are provided on the other longitudinal side to avoid facing the three through-holes.

It is to be noted that, since the through-holes are provided on the substrate 10 according to this Modification, it is preferable that a metal base substrate which comprises a metal such as aluminum be used as the substrate 10.

In addition, in this Modification as shown in (b) in FIG. 9, it is preferable that the sealing member 40 have a height that is higher than a height of each of the screws 4a. More specifically, it is preferable that a topmost position of the sealing member 40 be positioned above a topmost position of the screws 4a. With this configuration, it is possible to prevent light emitted from the sealing member 40 from being reflected at the screws 4a, and thus it is possible to suppress decrease in the light extraction efficiency or deterioration of light distribution characteristics.

In addition, the through-holes are provided on the both longitudinal sides according to this exemplary embodiment, however, the through-holes may be provided on only one of the longitudinal sides (only on one side). Furthermore, a through-hole is employed as the configuration for inserting the screw 4 according to this Modification, however, a notch may be employed as the configuration for inserting the screw 4 by providing the notch on the end of the substrate 10, instead of the through-hole. For example, it is possible to provide semi-circular notches on the longitudinal sides of the substrate 10, and the notches can be used for screw fixation. In addition, a standardized substrate may be used as the substrate 10 for mounting member.

[Modification]

Next, Modifications 1 to 14 of the present invention will be described in detail with reference to FIG. 11.

[Modification 1]

Figure 10:
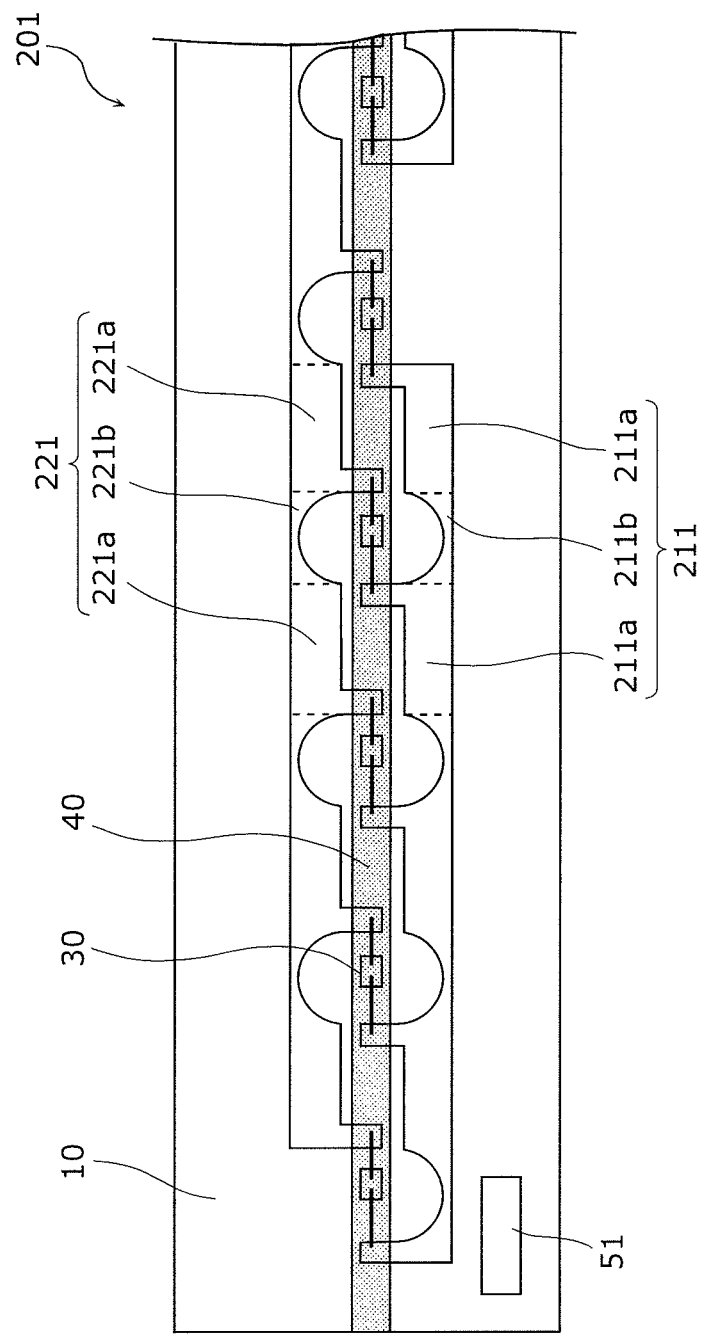
[FIG. 10]

For example, a mounting board and a light-emitting device which have a wiring pattern as shown in FIG. 10 may be employed. FIG. 10 is a partially enlarged plan view of a mounting board and a light-emitting device according to Modification 1 of the present invention.

As shown in FIG. 10, a light-emitting device 201 according to this Modification has a configuration resulting from removing part of the line around the LEDs 30 of the light-emitting device 200A according to Comparison 1 illustrated in (a) in FIG. 4.

The light-emitting device 201 according to this Modification includes a first line 211 and a second line 211 which are arranged to face each other across the LED element row of the LEDs 30. The first line 211 and the second line 211 are formed in the longitudinal direction of the substrate 10.

The first line 211 includes: a plurality of first main line portions 211b; and a plurality of first connecting portions 211a connected to adjacent ones of the first main line portions 211b. As with above, the second line 221 includes: a plurality of second main line portions 221b; and a plurality of second connecting portions 221a connected to adjacent ones of the second main line portions 221b.

Each of the first connecting portions 211a has a protruding portion formed to protrude toward the second line 221 in a region between the adjacent LEDs 30 (interelement region) so as to form a portion (wire connecting portion) for connecting to a corresponding one of the LEDs 30. In the same manner as above, each of the second connecting portions 221a has a protruding portion formed to protrude toward the first line 211 in a region between the adjacent LEDs 30 (interelement region) so as to form a portion (wire connecting portion) for connecting to a corresponding one of the LEDs 30. The first connecting portions 211a (the second connecting portions 221a) have a line width which is larger than a line width of the first main line portions 211b (the second main line portions 221b).

In addition, the gap between the first main line portions 211b and the second main line portions 211b becomes largest at the position where the LEDs 30 are mounted. More specifically, the gap between the first main line portions 211b and the second main line portions 221b, between each of the protruding portions of the first connecting portions 211a and a corresponding one of the protruding portions of the second connecting portions 221a, gradually increases toward the position where a corresponding one of the LEDs 30s is mounted, and gradually decreases away from the position where the LED 30 is mounted.

As described above, also in this Modification, the gap between the first main line portions 211b and the second main line portions 221b at positions where the LEDs 30 are mounted is larger than the gap between the first main line portions 211b and the second main line portions 221b at positions other than the positions where the LEDs 30 are mounted. With this configuration, it is possible to partially enlarge the gap between the first line 211 and the second line 222 around the region (light emitting portion) in which the LEDs 30 are mounted. Thus, it is possible to distance part of the first line 211 and part of the second line 221 from the LEDs 30. As a result, it is possible to prevent light of the LEDs 30 from being absorbed by the first line 211 and the second line 221 or from being reflected at the first line 211 and the second line 221. Accordingly, it is possible to obtain both ensuring of an insulation distance and suppressing decrease in the light extraction efficiency, while suppressing increase in Vf.

[Modification 2]

Figure 11:
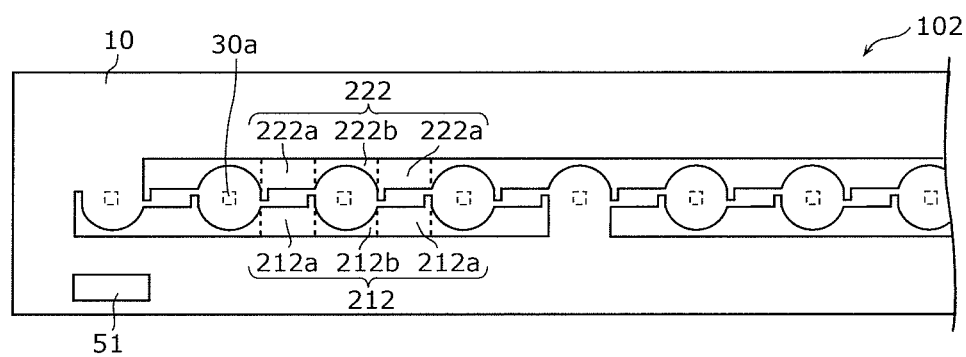
[FIG. 11]

FIG. 11 is a partially enlarged plan view of a mounting board according to Modification 2 of the present invention.

As shown in FIG. 11, a mounting board 102 according to this Modification has the same configuration as the configuration of the mounting board of the light-emitting device 201 according to Modification 1 shown in FIG. 10, other than that the shape of portions around the LED mounting positions 30a as a result of removing part of the lines is substantially circular.

The lines according to this Modification include a first line 212 and a second line 222 which are arranged to face each other across the LED element row in the same manner as Modification 1.

The first line 212 has a similar configuration to the configuration of the first line 211 in Modification 1, and includes a plurality of first main line portions 212b and a plurality of first connecting portions 212a each connected to adjacent ones of the first main line portions 211b.

The second line 222 has a similar configuration to the configuration of the second line 221 in Modification 1, and includes a plurality of second main line portions 222b and a plurality of second connecting portions 222a each connected to adjacent ones of the second main line portions 222b.

Each of the first connecting portions 212a (or the second connecting portions 222a) has a protruding portion formed to protrude toward the second line 222 (or the first line 212) in a region between the adjacent LEDs 30 (interelement region) so as to form a portion (wire connecting portion) for connecting to a corresponding one of the LEDs 30. The first connecting portions 212a (the second connecting portions 222a) have a line width which is larger than a line width of the first main line portions 212b (the second main line portions 222b).

According to this Modification, a region where the line is not present has substantially a circular shape, with the LED mounting position being the center. More specifically, an inner outline of each of the first main line portions 212b and an inner outline of each of the second main line portions 222b form substantially a circular shape. The first main line portions 212b (the second main line portions 222b) each have a line width which changes, between the protruding portion of each of the first connecting portions 212a and the protruding portion of a corresponding one of the second connecting portions 222a, such that the line width becomes smallest at the center. With this configuration, the gap between the first main line portions 212b and the second main line portions 222b, between the protruding portion of each of the first connecting portion 212 as and the protruding portions of a corresponding one of the second connecting portions 222a, gradually increases toward the position where a corresponding one of the LEDs 30 is mounted, and gradually decreases away from the position where the LED 30 is mounted.

As described above, also in this Modification, the gap between the first main line portions 212b and the second main line portions 222b at positions where the LEDs 30 are mounted is larger than the gap between the first main line portions 212b and the second main line portions 222b at positions other than the positions where the LEDs 30 are mounted. With this configuration, it is possible to obtain both ensuring of an insulation distance and suppressing decrease in the light extraction efficiency, while suppressing increase in Vf.

In addition, since the region where the line is not present has substantially a circular shape according to this Modification, it is preferable that an LED which has a square shape in a plan view be employed. With this configuration, since light of the LEDs diffuses isotropically, it is possible to suppress light loss of the LEDs due to the first line 212 and the second line 222 by the maximum degree.

It is to be noted that it is possible to form a light-emitting device by forming the LEDs 30 and the sealing member 40 in the mounting board 102 according to this Modification.

[Modification 3]

Figure 12:
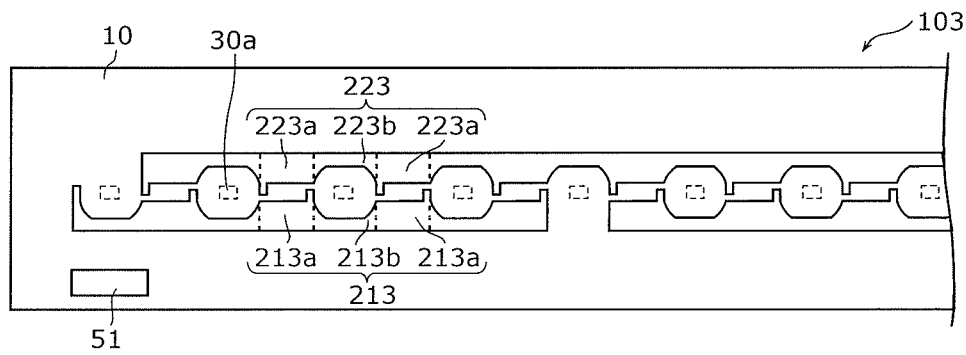
[FIG. 12]

FIG. 12 is a partially enlarged plan view of a mounting board according to Modification 3 of the present invention.

As shown in FIG. 12, a mounting board 103 according to this Modification has the same configuration as the configuration of the mounting board 102 according to Modification 2 shown in FIG. 11, other than that part of each of the inner outlines of the first main line portions and the second main line portions is changed from a curved shape to a straight line parallel to the longitudinal direction of the substrate 10, and the line width of each of the lines is increased.

The lines according to this Modification includes a first line 213 and a second line 223 which are arranged to face each other across the LED element row in the same manner as Modification 2.

The first line 213 has a similar configuration to the configuration of the first line 212 in Modification 2, and includes a plurality of first main line portions 213b and a plurality of first connecting portions 213a connected to adjacent ones of the first main line portions 213b.

The second line 223 has a similar configuration to the configuration of the second line 222 in Modification 2, and includes a plurality of second main line portions 223b and a plurality of second connecting portions 223a connected to adjacent ones of the second main line portions 223b.

Each of the first connecting portions 213a (or the second connecting portions 223a) has a protruding portion formed to protrude toward the second line 223 (or the first line 213) in a region between the adjacent LEDs 30 (interelement region) so as to form a portion (wire connecting portion) for connecting to a corresponding one of the LEDs 30. The first connecting portions 213a (the second connecting portions 223a) have a line width which is larger than a line width of the first main line portions 213b (the second main line portions 223b).

The first main line portions 213b and the second main line portions 223b according to this Modification each have a line width that is partly broader compared to the first main line portions 212b and the second main line portions 222b according to Modification 2, and thus it is possible to reduce the wiring resistance.

As described above, also in this Modification, the gap between the first main line portions 213b and the second main line portions 223b at positions where the LEDs 30 are mounted is larger than the gap between the first main line portions 213b and the second main line portions 223b at positions other than the positions where the LEDs 30 are mounted. With this configuration, it is possible to obtain both ensuring of an insulation distance and suppressing decrease in the light extraction efficiency, while suppressing increase in Vf. In addition, since the wiring resistance of the main line is smaller than the wiring resistance in Modification 2, it is possible to further suppress increase in Vf.

In addition, since the region where the line is not present has a horizontally long shape according to this Modification, it is preferable that an LED which has a rectangle shape in a plan view be employed. With this configuration, it is possible to suppress light loss of the LEDs due to the first line 213 and the second line 223 by the maximum degree.

In addition, it is possible to form a light-emitting device by forming the LEDs 30 and the sealing member 40 on the mounting board 103 according to this Modification.

[Modification 4]

Figure 13:
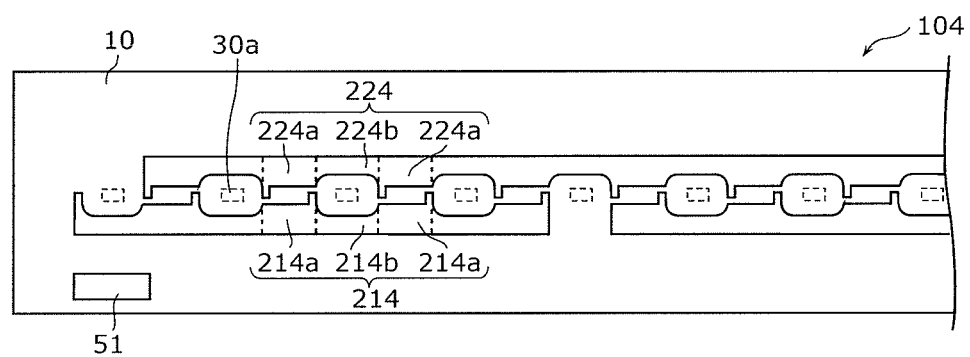
[FIG. 13]

FIG. 13 is a partially enlarged plan view of a mounting board according to Modification 4 of the present invention.

As shown in FIG. 13, a mounting board 104 according to this Modification has the same configuration as the configuration of the mounting board 103 according to Modification 3 shown in FIG. 12, other than that each of the straight line portions of each of the inner outlines of the first main line portions and the second main line portions is further elongated, and the line width of each of the lines is further increased than the line width of Modification 3.

The lines in a mounting board 104 according to this Modification includes a first line 214 and a second line 224 which are arranged to face each other across the LED element row in the same manner as Modification 3.

The first line 214 has a similar configuration to the configuration of the first line 213 in Modification 3, and includes a plurality of first main line portions 214b and a plurality of first connecting portions 214a connected to adjacent ones of the first main line portions 214b.

The second line 224 has a similar configuration to the configuration of the second line 223 in Modification 3, and includes a plurality of second main line portions 224b and a plurality of second connecting portions 224a connected to adjacent ones of the second main line portions 224b.

Each of the first connecting portions 214a (or the second connecting portions 224a) has a protruding portion formed to protrude toward the second line 224 (or the first line 214) in a region between the adjacent LEDs 30 (interelement region) so as to form a portion (wire connecting portion) for connecting to a corresponding one of the LEDs 30. The first connecting portions 214a (the second connecting portions 224a) have a line width which is larger than a line width of the first main line portions 214b (the second main line portions 224b).

The first main line portions 214b and the second main line portions 224b according to this Modification each have a line width that is partly broader compared to the first main line portions 213b and the second main line portions 223b according to Modification 3, and thus it is possible to further reduce the wiring resistance.

As described above, also in this Modification, the gap between the first main line portions 214b and the second main line portions 224b at positions where the LEDs 30 are mounted is larger than the gap between the first main line portions 214b and the second main line portions 224b at positions other than the positions where the LEDs 30 are mounted. With this configuration, it is possible to obtain both ensuring of an insulation distance and suppressing decrease in the light extraction efficiency, while suppressing increase in Vf. In addition, since the wiring resistance is further smaller than the wiring resistance in Modification 3, it is possible to further suppress increase in Vf.

In addition, since the region where the line is not present has a horizontally long shape according to this Modification as well, it is preferable that an LED which has a rectangle shape in a plan view be employed. With this configuration, it is possible to suppress light loss of the LEDs due to the first line 214 and the second line 224 by the maximum degree.

In addition, it is possible to form a light-emitting device by forming the LEDs 30 and the sealing member 40 in the mounting board 104 according to this Modification.

[Modification 5]

Figure 14:
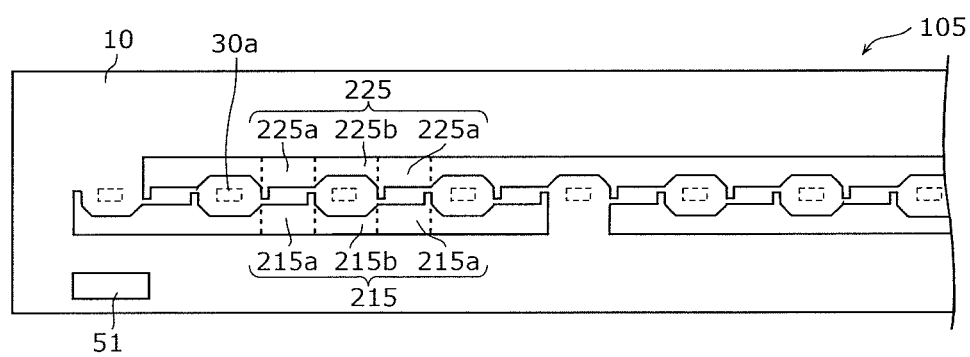
[FIG. 14]

FIG. 14 is a partially enlarged plan view of a mounting board according to Modification 5 of the present invention.

As shown in FIG. 14, a mounting board 105 according to this Modification has the same configuration as the configuration of the mounting board 104 according to Modification 4 shown in FIG. 13, other than that the curved portion (circular portion) of both ends of the straight line portion in the inside outline of each of the first main line portions and each of the second main line portions is shaped into a straight line which inclines toward the longitudinal side (or the short side) of the substrate 10.

The lines in a mounting board 105 according to this Modification includes a first line 215 and a second line 225 which are arranged to face each other across the LED element row in the same manner as Modification 4.

The first line 215 has a similar configuration to the configuration of the first line 214 in Modification 4, and includes a plurality of second main line portions 215*b* and a plurality of second connecting portions 215*a* connected to adjacent ones of the first main line portions 215*b*.

The second line 255 has a similar configuration to the configuration of the second line 224 in Modification 4, and includes a plurality of second main line portions 255*b* and a plurality of second connecting portions 255*a* connected to adjacent ones of the second main line portions 225*b*.

Each of the first connecting portions 215*a* (or the second connecting portions 225*a*) has a protruding portion formed to protrude toward the second line 225 (or the first line 215) in a region between the adjacent LEDs 30 (interelement region) so as to form a portion (wire connecting portion) for connecting to a corresponding one of the LEDs 30. The first connecting portions 215*a* (the second connecting portions 225*a*) have a line width which is larger than a line width of the first main line portions 215*b* (the second main line portions 225*b*).

The first main line portions 215*b* and the second main line portions 225*b* according to this Modification each have an area larger than an area of the first main line portions 214*b* and the second main line portions 224*b* according to Modification 4, and thus it is possible to further reduce the wiring resistance.

As described above, also in this Modification, the gap between the first main line portions 215*b* and the second main line portions 225*b* at positions where the LEDs 30 are mounted is larger than the gap between the first main line portions 215*b* and the second main line portions 225*b* at positions other than the positions where the LEDs 30 are mounted. With this configuration, it is possible to obtain both ensuring of an insulation distance and suppressing decrease in the light extraction efficiency, while suppressing increase in Vf. In addition, since the wiring resistance is further smaller than the wiring resistance in Modification 4, it is possible to further suppress increase in Vf.

In addition, since the region where the line is not present has a horizontally long shape according to this Modification as well, it is preferable that an LED which has a rectangle shape in a plan view be employed.

In addition, it is possible to form a light-emitting device by forming the LEDs 30 and the sealing member 40 in the mounting board 104 according to this Modification.

[Modification 6]

Figure 15:
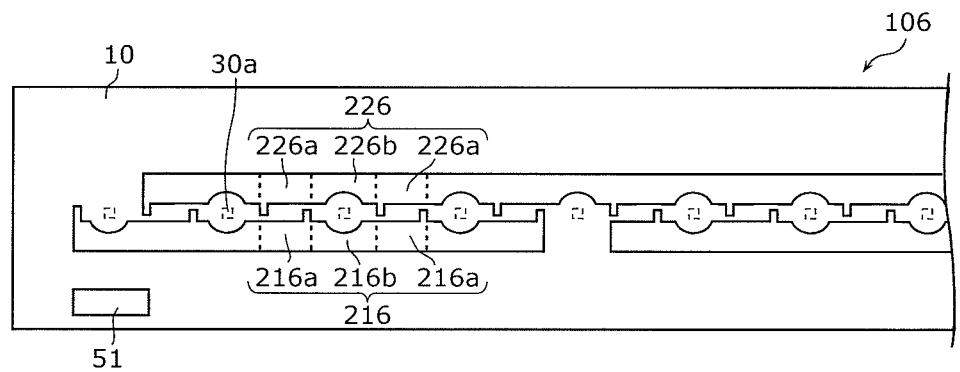
[FIG. 15]

FIG. 15 is a partially enlarged plan view of a mounting board according to Modification 6 of the present invention.

As shown in FIG. 15, a mounting board 106 according to this Modification has the same configuration as the mounting board 102 according to Modification 2 shown in FIG. 11, other than that the size of the circular portion in which the line is removed around the LED mounting positions 30*a* (LED).

The lines in a mounting board 106 according to this Modification includes a first line 216 and a second line 226 which are arranged to face each other across the LED element row in the same manner as Modification 2.

The first line 216 has a similar configuration to the configuration of the first line 212 in Modification 2, and includes a plurality of first main line portions 216*b* and a plurality of first connecting portions 216*a* connected to adjacent ones of the first main line portions 216*b*.

The second line 226 has a similar configuration to the configuration of the second line 222 in Modification 2, and includes a plurality of second main line portions 226*b* and a plurality of second connecting portions 222*a* connected to adjacent ones of the second main line portions 226*b*.

Each of the first connecting portions 216*a* (or the second connecting portions 226*a*) has a protruding portion formed to protrude toward the second line 226 (or the first line 216) in a region between the adjacent LEDs 30 (interelement region) so as to form a portion (wire connecting portion) for connecting to a corresponding one of the LEDs 30. The first connecting portions 216*a* (the second connecting portions 226*a*) have a line width which is larger than a line width of the first main line portions 216*b* (the second main line portions 226*b*).

According to this Modification, the size of the circular portion in which the line around each of the LED mounting positions 30*a* is removed is decreased compared to Modification 2. With this configuration, the first main line portions 216*b* and the second main line portions 226*b* each have a line width that is partly broader compared to Modification 2, and thus it is possible to reduce the wiring resistance.

As described above, also in this Modification, the gap between the first main line portions 216*b* and the second main line portions 226*b* at positions where the LEDs 30 are mounted is larger than the gap between the first main line portions 216*b* and the second main line portions 226*b* at positions other than the positions where the LEDs 30 are mounted. With this configuration, it is possible to obtain both ensuring of an insulation distance and suppressing decrease in the light extraction efficiency, while suppressing increase in Vf. In addition, since the wiring resistance is smaller than the wiring resistance in Modification 2, it is possible to further suppress increase in Vf.

In addition, according to this Modification, since the size of the circular portion in which the line is removed around the LED mounting positions 30*a* is decreased, it is preferable that LEDs each of which is square in a plan view and has a size smaller than the size in Modification 2 be employed. With this configuration, it is possible to suppress light loss of the LEDs due to the first line 216 and the second line 226 by the maximum degree.

In addition, it is possible to form a light-emitting device by forming the LEDs 30 and the sealing member 40 on the mounting board 106 according to this Modification.

Modification 7

Figure 16:
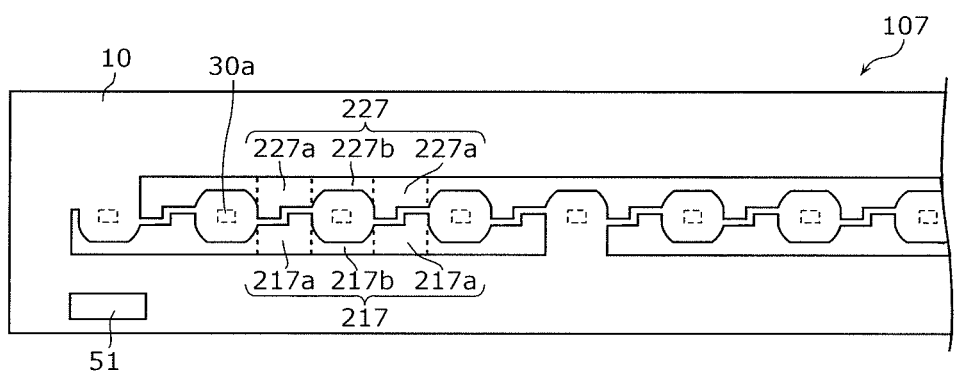
[FIG. 16]

FIG. 16 is a partially enlarged plan view of a mounting board according to Modification 7 of the present invention.

As shown in FIG. 16, a mounting board 107 according to this Modification has the same configuration as the configuration of the mounting board 103 according to Modification 3 shown in FIG. 12, other than that the region of the wire connecting portions of each of the first main line portions and the second main line portions are enlarged.

The lines in the mounting board 107 according to this Modification includes a first line 217 and a second line 227 which are arranged to face each other across the LED element row in the same manner as Modification 3.

The first line 217 has a similar configuration to the configuration of the first line 213 in Modification 3, and includes a plurality of first main line portions 217*b* and a plurality of first connecting portions 217*a* connected to adjacent ones of the first main line portions 217*b*.

The second line 227 has a similar configuration to the configuration of the second line 223 in Modification 3, and includes a plurality of second main line portions 227*b* and a plurality of second connecting portions 227*a* connected to adjacent ones of the second main line portions 227*b*.

Each of the first connecting portions 217*a* (or the second connecting portions 227*a*) has a protruding portion formed to protrude toward the second line 227 (or the first line 217) in a region between the adjacent LEDs 30 (interelement region) so as to form a portion (wire connecting portion) for connecting to a corresponding one of the LEDs 30.

The first main line portions 217b and the second main line portions 227b according to this Modification each include the wire connecting portion (protruding portion) having a larger area compared to the first main line portions 213b and the second main line portions 223b described in Modification 3, and thus it is possible to reduce the wiring resistance. It is to be noted that, the first main line portions 217b and the second main line portions 227b have the wire connecting portions which have the same length (the length measured in the longitudinal direction of the substrate 10) and the same width (the length measured in the crosswise direction of the substrate 10) so as to have the same wiring resistance, according to this Modification.

As described above, also in this Modification, the gap between the first main line portions 217b and the second main line portions 227b at positions where the LEDs 30 are mounted is larger than the gap between the first main line portions 217b and the second main line portions 227b at positions other than the positions where the LEDs 30 are mounted. With this configuration, it is possible to obtain both ensuring of an insulation distance and suppressing decrease in the light extraction efficiency, while suppressing increase in Vf. In addition, since the wiring resistance of the main line is smaller than the wiring resistance in Modification 3, it is possible to further suppress increase in Vf.

In addition, since the region where the line is not present has a horizontally long shape according to this Modification as well, it is preferable that an LED which has a rectangle shape in a plan view be employed. With this configuration, it is possible to suppress light loss of the LEDs due to the first line 217 and the second line 227 by the maximum degree.

In addition, it is possible to form a light-emitting device by forming the LEDs 30 and the sealing member 40 on the mounting board 104 according to this Modification.

[Modification 8]

Figure 17:
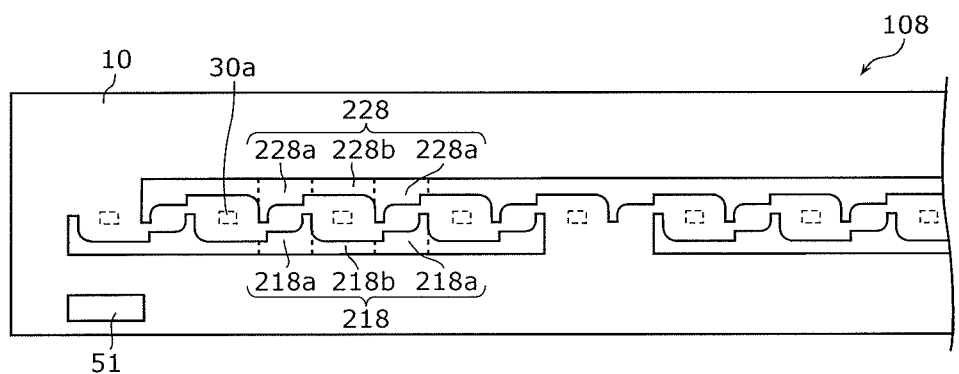
[FIG. 17]

FIG. 17 is a partially enlarged plan view of a mounting board according to Modification 8 of the present invention.

As shown in FIG. 17, a mounting board 108 according to this Modification has the same configuration as the configuration of the mounting board 100 according to Embodiment 1 shown in FIG. 1, other than that the width of each of the first main line portions and the second main line portions is partially enlarged.

The lines in the mounting board 108 according to this Modification includes a first line 218 and a second line 228 which are arranged to face each other across the LED element row in the same manner as Embodiment 1.

The first line 218 has a similar configuration to the configuration of the first line 21 in Embodiment 1, and includes a plurality of first main line portions 218b and a plurality of first connecting portions 218a connected to adjacent ones of the first main line portions 218b.

The second line 228 has a similar configuration to the configuration of the second line 22 in Embodiment 1, and includes a plurality of second main line portions 228b and a plurality of second connecting portions 228a connected to adjacent ones of the second main line portions 228b.

Each of the first connecting portions 218a (or the second connecting portions 228a) has a protruding portion formed to protrude toward the second line 228 (or the first line 218) in a region between the adjacent LEDs 30 (interelement region) so as to form a portion (wire connecting portion) for connecting to a corresponding one of the LEDs 30.

According to this Modification, part of the first main line portion 21b and part of the second main line portion 22b are each formed to protrude so as to have a step, thereby forming the first connecting portions 218a and the second connecting portions 228a. It is possible to enlarge the areas of the first connecting portions 218a and the second connecting portions 228a by providing the step. With this configuration, it is possible to reduce the wiring resistance of the first main line portions 218b and the second main line portions 228b according to this Modification to be smaller than the wiring resistance of the first main line portions 21b and the second main line portions 22b according to Embodiment 1.

It is to be noted that, although the gap between the first connecting portion 218a and the second connecting portion 228a has a shape bending according to the above-described step according to this Modification, the gap between the first connecting portion 218a and the second connecting portion 228a may be linearly shaped without bending (in other words, the line width may be simply enlarged without providing a step). However, it is possible, when the LEDs 30 and the first connecting portions 218a (the second connecting portions 228a) are connected through wire bonding, to align all of the wires in a straight line in the longitudinal direction of the substrate 10, by providing a step to each of the first connecting portions 218a and each of the second connecting portions 228a to bend the shape of the gap between the first connecting portion 218a and the second connecting portion 228a. With this configuration, it is possible to reduce the restriction which the sealing component 40 receives from the gold wires when the sealing component 40 is applied to the substrate 10 in the longitudinal direction, and thus the sealing component 40 can be applied into a desired shape.

As described above, also in this Modification, the gap between the first main line portions 218b and the second main line portions 228b at the LED mounting positions 30a is larger than the gap between the first main line portions 218b and the second main line portions 228b at positions other than the LED mounting positions 30a. With this configuration, it is possible to obtain both ensuring of an insulation distance and suppressing decrease in the light extraction efficiency, while suppressing increase in Vf. In addition, since the wiring resistance is smaller than the wiring resistance in Modification 1, it is possible to further suppress increase in Vf.

In addition, since the region where the line is not present has a horizontally long shape according to this Modification as well, it is preferable that an LED which has a rectangle shape in a plan view be employed. With this configuration, it is possible to suppress light loss of the LEDs due to the first line 218 and the second line 228 by the maximum degree.

It is to be noted that it is possible to form a light-emitting device by forming the LEDs 30 and the sealing member 40 on the mounting board 108 according to this Modification.

[Modification 9]

Figure 18:
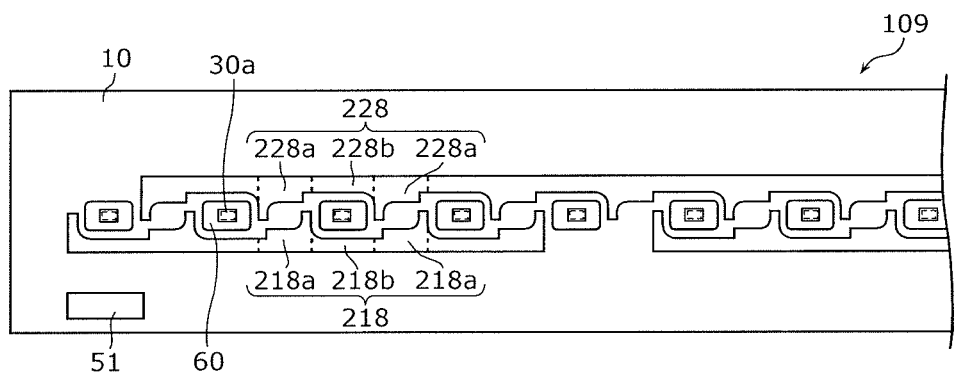
[FIG. 18]

FIG. 18 is a partially enlarged plan view of a mounting board according to Modification 9 of the present invention.

As shown in FIG. 18, a mounting board 109 according to this Modification further includes a phosphor layer 60 around each of the LED mounting positions 30a, in addition to the configuration of the mounting board 108 according to Modification 8 shown in FIG. 17.

The phosphor layer 60 is formed into an annular shape to enclose the LED mounting position 30a (LED) on the LED mounting surface of the substrate 10. In addition, the phosphor layer 60 is disposed between each of the first main line portions 218b and a corresponding one of the second main line portions 228b.

The phosphor layer 60 includes a wavelength converting material (a phosphor particle or the like) which converts a wavelength of light emitted from the LEDs. For example, the phosphor layer 60 may be a sintered body layer which includes phosphor particles and a material for sinter bonding.

When the LED is a blue LED which emits blue light, a YAG yellow phosphor particle, for example, may be used as the phosphor particle in order to emit white light from the phosphor layer 60.

As the material for sinter bonding, an inorganic material such as a glass frit made of a material composed mainly of oxide silicon ($SiO_2$) can be employed. The glass frit is a bonding material (binding material) for binding the phosphor particles to the substrate 10, and is made of a material having a high transmittance with respect to visible light.

The phosphor layer 60 can be formed as below, for example. First, a solvent is added to a phosphor particle and a powdered frit glass (powder glass) and they are kneaded into a paste. Next, the paste is applied to the substrate 10 in a predetermined shape, dried, and burnt. With this, the glass frit softens, and thus it is possible to form a phosphor layer (sintered body layer) 60 in which the phosphor particle and the substrate 10 are bound (bonded) by the glass frit.

As described above, also in this Modification, the gap between the first main line portions 218*b* and the second main line portions 228*b* at the LED mounting positions 30*a* is larger than the gap between the first main line portions 218*b* and the second main line portions 228*b* at positions other than the LED mounting positions 30*a*. With this configuration, it is possible to obtain both ensuring of an insulation distance and suppressing decrease in the light extraction efficiency, while suppressing increase in Vf.

In addition, in the Modification 8, the phosphor layer 60 is formed around each of the LED mounting positions 30*a* (LEDs) With this configuration, it is possible to convert the wavelength of light from the LEDs by the phosphor layer 60 as well.

Furthermore, the phosphor layer 60 according to this Modification is a sintered body layer. With this configuration, it is possible to form the phosphor layer 60 to have an even thickness.

In addition, in this Modification, the phosphor layer 60 is not formed at the LED mounting positions 30*a* (LEDs). With this configuration, since the phosphor layer 60 is not present immediately below the LEDs, it is possible to effectively dissipate heat of the LEDs to the substrate 10. It is to be noted that, the phosphor layer 60 may be formed also at the LED mounting positions 30*a* (that is, immediately below the LEDs).

In addition, it is possible to form a light-emitting device by forming the LEDs 30 and the sealing member 40 in the mounting board 109 according to this Modification.

[Modification 10]

Next, a mounting board according to Modification 10 of the present invention will be described.

The light-emitting device according to the above-described embodiments and modifications has a COB configuration in which LED chips are directly mounted on the substrate 10 as the LEDs 30, however, the configuration is not limited to this. For example, a surface mount device (SMD) LED element may be employed as the LED 30. The SMD LED element includes, for example, a resin package (container) having a recessed portion, an LED chip (light-emitting element) mounted in the recessed portion, and a sealing member (a phosphor-containing resin) filled in the recessed portion.

A white package is employed in many cases in the SMD LED element, however, light leaks from the white package as well. In addition, in order to alleviate luminance unevenness caused by discontinuously arranging the SMD LED elements, a package having a high transmittance is employed in some cases so as to positively emit light from a side of the package. As described above, even when the SMD elements are employed as the LED 30, there are cases where light from the SMD element is absorbed and/or reflected by the line 20 that is present around the LED elements.

Figure 19A:
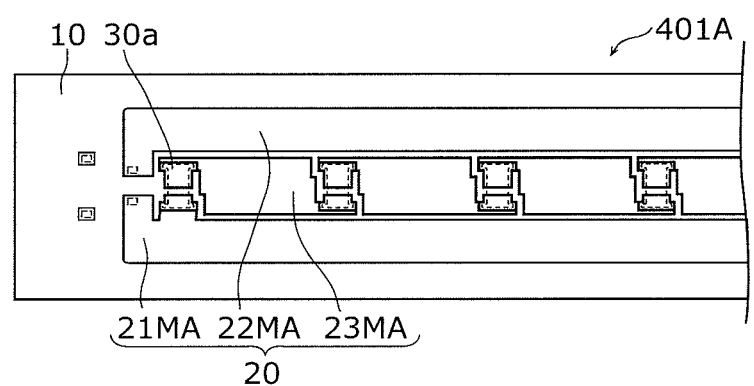
[FIG. 19A]
Figure 19B:
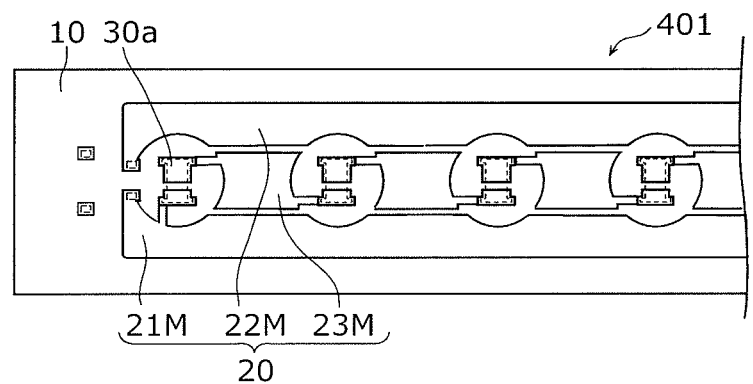
[FIG. 19B]

The line 20 illustrated in each of FIG. 19A and FIG. 19B shows a pattern for connecting the SMD LED element in series and in parallel. FIG. 19A is a partially enlarged plan view of a mounting board according to Comparison 3 of the present invention. FIG. 19B is a partially enlarged plan view of a mounting board according to Modification 10 of the present invention. It is to be noted that, in FIG. 19A and FIG. 19B, regions enclosed by broken lines indicate the positions at which the SMD LED elements are to be mounted (LED mounting positions 30*a*).

In a mounting board 401A according to Comparison 3 illustrated in FIG. 19A, a first line 21MA, a second line 22MA, and a third line 23MA are concentrated around the LED mounting positions 30*a*. With this configuration, light from the SMD elements is absorbed and/or reflected and thus light extraction efficiency decreases.

In comparison with the mounting board 401 according to Comparison 3 illustrated in FIG. 19A, a mounting board 401 according to this Modification illustrated in FIG. 19B has a configuration in which the line 20 around the LED mounting positions 30*a* is partially removed.

More specifically, the line 20 according to this Modification includes: the first line 21M and the second line 22M which are formed to face each other across the LED element row; and the third line 23M disposed between the first line 21M and the second line 22M.

The first line 21M includes: a first main line portion; and a first connecting portion (protruding portion) having a connecting portion for connecting to the LED elements at the LED mounting positions. The second line 22M includes: a second main line portion; and a second connecting portion having a connecting portion for connecting to the LED elements. The third line 23M includes: a third main line portion; and a third connecting portion (protruding portion) having a connecting portion for connecting to the LED elements at the LED mounting positions 30*a*. It is to be noted that connection between the SMD LED elements and the first line 21M (the first connecting portion) or the third line 23M (the third connecting portion) can be carried out by flip-chip mounting or the like.

According to this Modification, the portion around each of the LED mounting positions 30*a* after removing part of the line has a substantially circular shape. More specifically, an inner outline of the first line 21M (the first main line portion), an inner outline of the second line 22M (the second main line portion), and an inner outline of the third line 23M form substantially a circular shape. With this configuration, it is possible to partially enlarge the gap between the first line 21M and the second line 22M around the LED mounting positions 30*a*. Thus, it is possible to distance part of the first line 21M, the second line 22M, and the third line 23M from the LEDs 30.

As described above, also in this Modification, the gap between the first line 21M (the first main line portion) and the second line 22M (the second main line portion) at the LED mounting positions 30*a* is larger than the gap between the first line 21M (the first main line portion) and the second line 22M (the second main line portion) at positions other than the LED mounting positions 30*a*. With this configuration, it is possible to obtain both ensuring of an insulation distance and suppressing decrease in the light extraction efficiency, while suppressing increase in Vf.

It is to be noted that, in this Modification, it is possible to supply, for example, a positive voltage to the first line 21M and a negative voltage to the second line 22M and the third line 23M. In this case, the second line 22M and the third line 23M are electrically and physically connected by a wiring pattern or the like (not illustrated). It is to be noted that, the first line 21M may be supplied with the negative voltage and the second line 22M and the third line 23M may be supplied with the positive voltage.

[Modification 11]

Figure 20A:
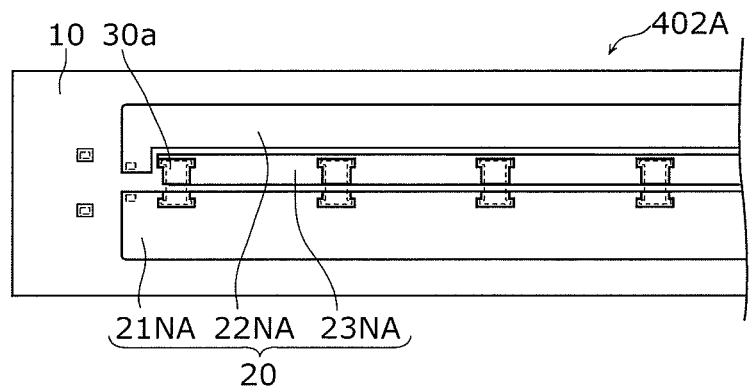
[FIG. 20A]
Figure 20B:
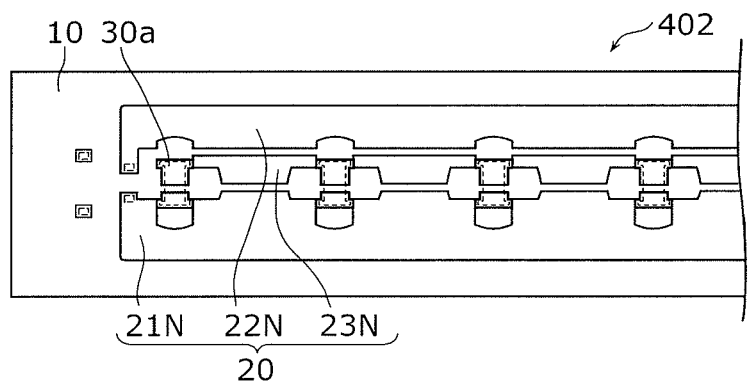
[FIG. 20B]

Next, a wiring pattern in the case where the SMD LED elements are connected by in parallel and in series will be described with reference to FIG. 20A and FIG. 20B. FIG. 20A is a partially enlarged plan view of a mounting board according to Comparison 4. FIG. 20B is a partially enlarged plan view of a mounting board according to Modification 11 of the present invention. It is to be noted that, in FIG. 20A and FIG. 20B, regions enclosed by broken lines indicate the positions at which the SMD LEDs are to be mounted (LED mounting positions 30a).

In a mounting board 402A according to Comparison 4 illustrated in FIG. 20A, a first line 21NA, a second line 22NA, and a third line 23NA are concentrated around the LED mounting positions 30a. With this configuration, light from the SMD elements is absorbed and/or reflected and thus light extraction efficiency decreases.

In comparison with the mounting board 402A according to Comparison 4 illustrated in FIG. 20A, a mounting board 402 according to this Modification illustrated in FIG. 20B has a configuration in which the line 20 around the LED mounting positions 30a is partially removed.

More specifically, the line 20 according to this Modification includes: the first line 21N and the second line 22N which are formed to face each other across the LED element row; and the third line 23N disposed between the first line 21N and the second line 22N.

The first line 21N includes: a first main line portion; and a first connecting portion (protruding portion) having a connecting portion for connecting to the LED elements at the LED mounting positions 30a. The second line 22N includes: a second main line portion; and a second connecting portion having a connecting portion for connecting to the LED elements. The third line 23N includes: a third main line portion; and a third connecting portion (protruding portion) having a connecting portion for connecting to the LED elements at the LED mounting positions 30a. It is to be noted that connection between the SMD LED elements and the first line 21N (the first connecting portion) or the third line 23N (the third connecting portion) can be carried out by flip-chip mounting or the like in the same manner as in Modification 10.

With the first line 21N, the second line 22N, and the third line 23N according to this Modification, part of the first line 21NA, part of the second line 22NA, and part of the third line 23NA of Comparison 4 are removed such that the portion where the parts are removed forms a substantially cross shape with the LED mounting position being the center. With this configuration, it is possible to partially enlarge the gap between the first line 21N (or the third line 23N) and the second line 22N around the LED mounting positions 30a. Thus, it is possible to distance part of the first line 21N, part of the second line 22N, and part of the third line 23N from the LEDs 30.

As described above, also in this Modification, the gap between the first line 21N (the first main line portion) and the second line 22N (the second main line portion) at the LED mounting position 30a is larger than the gap between the first line 21N (the first main line portion) and the second line 22N (the second main line portion) at positions other than the LED mounting position 30a. With this configuration, it is possible to obtain both ensuring of an insulation distance and suppressing decrease in the light extraction efficiency, while suppressing increase in Vf.

It is to be noted that, in this Modification, it is possible to supply a positive voltage to the first line 21N and a negative voltage to the second line 22N and the third line 23N, for example. In this case, the second line 22N and the third line 23N are electrically and physically connected by a wiring pattern or the like (not illustrated). It is to be noted that, the first line 21N may be supplied with the negative voltage and the second line 22N and the third line 23N may be supplied with the positive voltage.

[Modification 12]

Next, Modification 12 according to the present invention will be described with reference to FIG. 21. FIG. 21 is a perspective view of a source for illumination according to Modification 12 of the present invention. This Modification is an example in which the light-emitting device 200 according to above-described Embodiment 1 is applied to a source for illumination.

The source for illumination according to this Modification is a linear tube LED lamp 500 that substitutes for a conventional linear tube fluorescent lamp, and is, for example, a linear tube 40-type LED lamp having an entire length that is the same as an entire length of a straight tube 40-type fluorescent lamp, for example.

As shown in FIG. 21, the linear tube LED lamp 500 includes: a housing 510 made of glass or resin and having an elongate cylindrical shape; a plurality of light-emitting devices 200 disposed in the housing 510; and a pair of bases 520 and 530 disposed at both ends of the housing 510. The plurality of light-emitting devices 200 are electrically connected to one another by, for example, connector lines 540. In addition, although not illustrated, the housing 510 may include: a lighting circuit for causing the light-emitting devices 200 to emit light, or a heat sink (a metal pedestal) for mounting the light-emitting devices 200.

[Modification 13]

Figure 22:
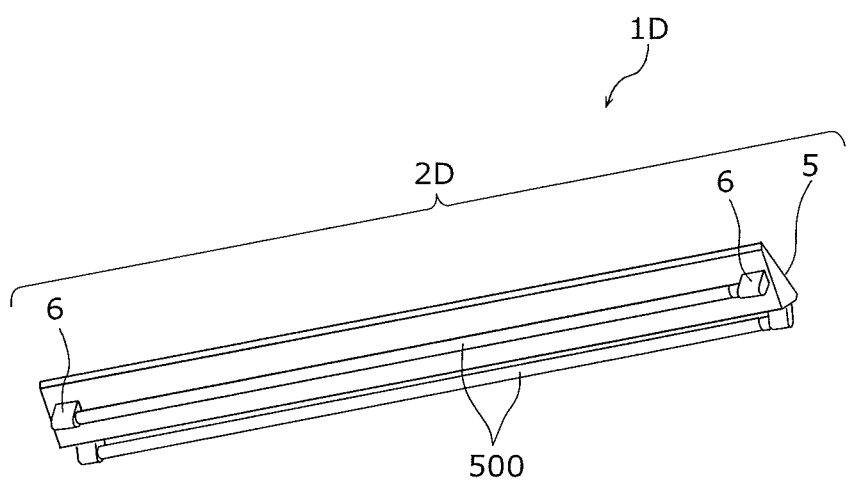
[FIG. 22]

Next, Modification 13 according to the present invention will be described with reference to FIG. 22. FIG. 22 is a perspective view of a lighting apparatus according to Modification 13 of the present invention.

As shown in FIG. 22, a lighting apparatus 1D according to this Modification is a base light lighting apparatus having a source for illumination, and includes, for example, the linear tube LED lamp 500 and a lighting equipment 2D shown in FIG. 21.

The lighting equipment 2D includes an equipment body 5 and a pair of sockets 6 attached to the equipment body 5. The pair of sockets 6 is electrically connected to the linear tube LED lamp 500 and holds the linear tube LED lamp 500. The equipment body 5 can be shaped by pressing an aluminized plate, for example. In addition, an inner surface of the equipment body 5 is a reflecting surface which reflects, in a predetermined direction (for example, downward), light emitted from the LED lamp 500.

The lighting equipment 2D formed as described above is attached to a ceiling or the like via a fixture, for example. It is to be noted that the lighting equipment 2D includes therein a power supply circuit or the like for controlling lighting of the linear tube LED lamp 500. In addition, a transparent cover component may be provided to cover the linear tube LED lamp 500.

[Modification 14]

Figure 23:
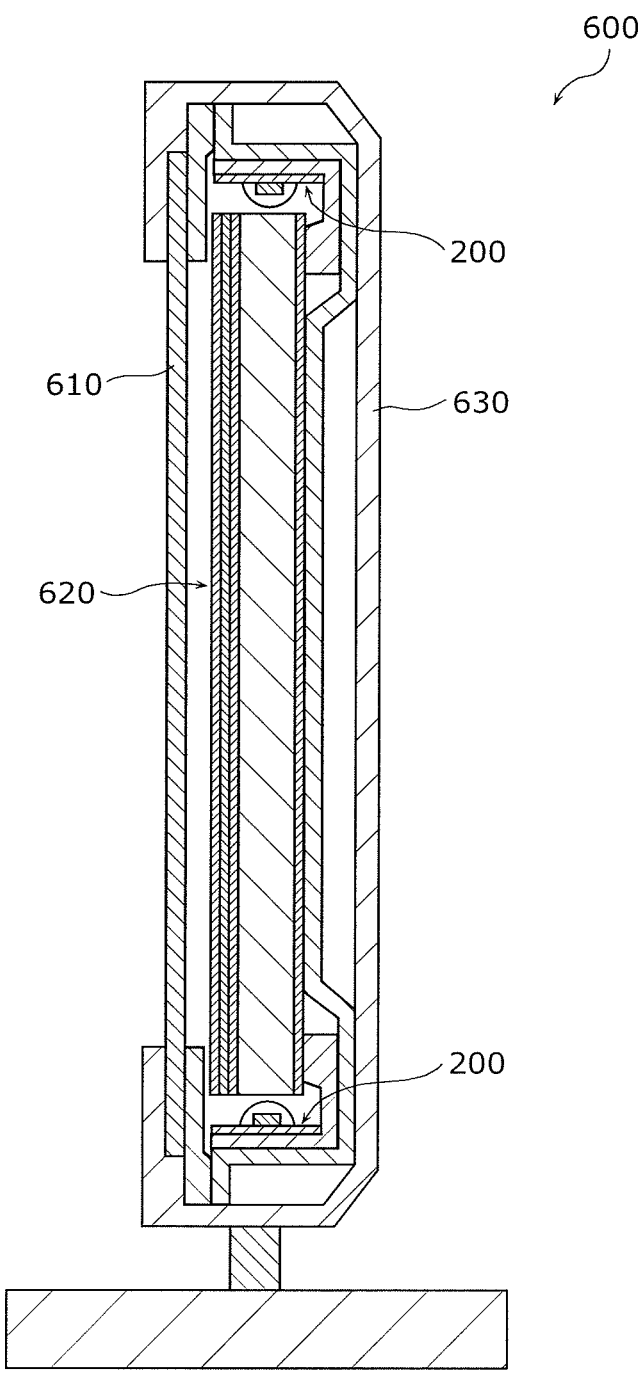
[FIG. 23]

Next, Modification 14 according to the present invention will be described with reference to FIG. 23. FIG. 23 is a cross-sectional view of a liquid-crystal display apparatus according to Modification 14 of the present invention. In the liquid-crystal display apparatus according to this Modification includes therein a backlight unit including the light-emitting device 200.

As shown in FIG. 23, a liquid-crystal display apparatus 600 according to this Modification is, for example, a liquid-crystal display television or a liquid-crystal display monitor and includes: a liquid-crystal display panel 610; a backlight unit 620 disposed behind the liquid-crystal display panel 610; a housing 630 in which the liquid-crystal display panel 610 and the backlight unit 620 are housed.

The backlight unit 620 is an edge light backlight unit in which the light-emitting devices 200 are disposed on a side of a light guide plate, and includes a reflection sheet, a light guide plate, and an optical sheet group other than the light-emitting devices 200.

As described above, the light-emitting device 200 can be applied not only as a light source for illumination but also as a light source for a display apparatus.

Others

The light-emitting device, the lighting apparatus, and the like according to the present invention have been described based on the embodiments and modifications as above; however, the present invention is not limited to these embodiments and modifications.

For example, the LEDs 30 are mounted one by one in non-line regions which are defined by distancing part of the first line and the second line from the LEDs 30 (between the first main line portions and the second main line portions) according to the embodiments and the modifications as described above, however, two or more LEDs 30 may be mounted in one of the non-line regions. In this case, it is preferable that the arrangement of the LEDs to be mounted be determined according to the shape of the above-described non-line region. For example, when the non-line region is horizontally long, it is preferable that two LEDs 30 which are square in a plan view be mounted side-by-side. With this configuration, it is possible to effectively suppress light loss of the LEDs caused by the first line and the second line.

In addition, although the first main line portions and the second main line portions are each formed such that the inner outline has a curved shape so that the gap between the first main line portions and the second main line portions changes in the example presented in the above-described embodiments, the shape is not limited to this. The gap between the first main line portions and the second main line portions may be changed by forming the first main line portions and the second main line portions to each have a linear inner outline. Alternatively, the gap between the first main line portions and the second main line portions may be changed by employing a shape which is not curved nor linear.

In addition, the overall shape of each of the lines (the first line and the second line) is not limited to those disclosed in the above-described embodiments and modifications. Another shape of the first line and the second line may be staggered with a fixed line width.

In addition, the light-emitting device of a line type in which the substrate has an elongate shape is illustrated as an example in the above-described embodiments and modifications, however, the present invention may also be applied to a light-emitting device of a square type in which a substrate has a square shape.

In addition, the light-emitting device is used as a light source for illumination and a light source for a display apparatus in the example presented in the above-described embodiments and modifications, however, the present invention is not limited to this. The light-emitting device according to the above-described embodiments and modifications can be also used as a light source for other electronic devices such as a light source for a lamp of a copy machine, a light source for a guide light, a signboard device, and the like. Other applications include a light source for industrial application such as a light source for an inspection line. It is to be noted that, although the light-emitting device applied to a linear tube LED lamp is shown as an example in Modification 12, the light-emitting device can also be applied to an LED light bulb lamp or a circular lamp.

In addition, although the light-emitting device emits white light resulting from a blue LED and a yellow phosphor according to the above-described embodiments and modifications, the present invention is not limited to this. For example, white light may be emitted by using a phosphor-containing resin including a red phosphor and a green phosphor, and combining the phosphor-containing resin and the blue LED. Furthermore, an LED which emits color of light other than blue may be employed.

In addition, the semiconductor light-emitting element used in the light-emitting device is an LED according to the above-described embodiments and modifications; however, a light-emitting element such as a semiconductor laser, an organic EL (electro luminescence) and an inorganic EL may be used.

It is to be noted that the present invention also includes other forms in which various modifications apparent to those skilled in the art are applied to the embodiments or forms in which structural elements and functions in plural embodiments, modifications, and examples are arbitrarily combined within the scope of the present invention.

INDUSTRIAL APPLICABILITY

The present invention is useful as a substrate for mounting a light-emitting element, a light-emitting device including the substrate, and a lighting apparatus including the light-emitting device, and can be widely used in various light sources such as a light source for illumination and a light source for a display apparatus.

REFERENCE SIGNS LIST 1, 1A, 1B, 1C, 1D lighting apparatus
2, 2A, 2B, 2C, 2D lighting equipment
3 mounting member
4, 4a screw
5 equipment body
6 socket
10 substrate
20 line
21, 21A, 21B, 21X, 21Y, 211, 212, 213, 214, 215, 216, 217, 218, 21M,
21MA, 21N, 21NA first line
21L, 21XL, 22L, 22XL outline
21a, 21Xa, 21Ya, 211a, 212a, 213a, 214a, 215a, 216a, 217a, 218a
first connecting portion
21b, 21Xb, 21Yb, 211b, 212b, 213b, 214b, 215b, 216b, 217b, 218b first main line portion
22, 22A, 22B, 22X, 22Y, 221, 222, 223, 224, 225, 226, 227, 228, 22M,
22MA, 22N, 22NA second line
22a, 22Xa, 22Ya, 221a, 222a, 223a, 224a, 225a, 226a, 227a, 228a
second connecting portion
22b, 22Xb, 22Yb, 221b, 222b, 223b, 224b, 225b, 226b, 227b, 228b
second main line portion
23Y, 23, 23M, 23MA, 23N, 23NA third line
23Ya third connecting portion
23Ya third connecting portion
24a, 24b auxiliary line
30 LED
30a LED mounting position
40 sealing member
51 first electrode
52 second electrode
60 phosphor layer
100, 100X, 100Y, 102, 103, 104, 105, 106, 107, 108, 109, 401, 401A, 402, 402A mounting board
200, 200A, 200B, 200Y, 201, 300 light-emitting device
500 linear tube LED lamp
510 casing
520, 530 base
540 connector line
600 liquid-crystal display apparatus
610 liquid-crystal display panel
620 backlight unit
630 housing

The invention claimed is:

1. A substrate on which a plurality of semiconductor light-emitting elements are to be linearly mounted to form an element row, the substrate comprising:
a first line and a second line which are disposed such that the element row is interposed therebetween,
wherein the first line includes a first main line portion extending mainly in a row direction of the element row, and a first connecting portion connected to the first main line portion and including a portion for connecting to a corresponding one of the semiconductor light-emitting elements,
the second line includes a second main line portion extending mainly in the row direction of the element row, and a second connecting portion connected to the second main line portion and including a portion for connecting to a corresponding one of the semiconductor light-emitting elements, and
a gap between the first main line portion and the second main line portion has a maximum size at element mounting positions, at which the semiconductor light-emitting elements are to be mounted, wherein the first line includes a plurality of the first connecting portions,
the second line includes a plurality of the second connecting portions, and
the first connecting portions, the second connecting portions and the semiconductor light-emitting elements are alternately positioned in an aligned direction of the semiconductor light-emitting elements.

2. The substrate according to claim 1, wherein
the first main line portion connects adjacent ones of the first connecting portions,
the second main line portion connects adjacent ones of the second connecting portions,
the first connecting portions each includes a protruding portion which protrudes toward the second line in a region between adjacent ones of the element mounting positions, the protruding portion being a portion for connecting to a corresponding one of the semiconductor light-emitting elements, and
the second connecting portions each includes a protruding portion which protrudes toward the first line in a region between adjacent ones of the element mounting positions, the protruding portion being a portion for connecting to a corresponding one of the semiconductor light-emitting elements.

3. The substrate according to claim 2,
wherein the first main line portion has a line width that is larger at a position close to the first connecting portions than at a position facing a corresponding one of the element mounting positions.

4. The substrate according to claim 2,
wherein the second main line portion has a line width that is larger at a position close to the second connecting portions than at a position facing a corresponding one of the element mounting positions.

5. The substrate according to any one of claim 1,
wherein at least one of (i) an outline of the first main line portion facing the second line and (ii) an outline of the second main line portion facing the first line is curved.

6. The substrate according to claim 1,
wherein the element row includes a first element row and a second element row each of which includes the plurality of semiconductor light-emitting elements,
the substrate further comprises a third line,
the first line and the second line are disposed such that the first element row is interposed therebetween,
the second line and the third line are disposed such that the second element row is interposed therebetween, the third line includes a third main line portion extending mainly in an row direction of
the second element row, and a third connecting portion connected to the third main line portion and including a portion for connecting to a corresponding one of the semiconductor light-emitting elements in the second element row,
the third connecting portion includes a protruding portion which protrudes toward the second line in a region between adjacent ones of the element mounting positions in the second element row, the protruding portion being a portion for connecting to a corresponding one of the semiconductor light-emitting elements in the second element row,
the second connecting portion further includes a protruding portion protruding toward the third line in a region between adjacent ones of the element mounting positions,
the gap between the first main line portion and the second main line portion has the maximum size at the element mounting positions in the first element row, and
a gap between the second main line portion and the third main line portion is larger at the element mounting positions in the second element row than at positions other than the element mounting positions in the second element row.

7. The substrate according to claim 6,
wherein the element mounting positions in the first element row and the element mounting positions in the second element row are alternately placed to avoid facing each other, and
the second line is formed to protrude alternately to a region between adjacent ones of the element mounting positions in the first element row and to a region between adjacent ones of the element mounting positions in the second element row.

8. The substrate according to claim 1, wherein the substrate is a ceramic substrate.

9. The substrate according to claim 1, further comprising a phosphor layer around each of the element mounting positions.

10. A light-emitting device comprising:
a substrate;
an element row including a plurality of semiconductor light-emitting elements mounted linearly on the substrate; and
a first line and a second line which are disposed such that the element row is interposed therebetween,
wherein the first line includes a first main line portion extending mainly in the row direction of the element row, and a first connecting portion connected to the first main line portion and including a portion for connecting to a corresponding one of the semiconductor light-emitting elements,
the second line includes a second main line portion extending mainly in the row direction of the element row, and a second connecting portion connected to the second main line portion and including a portion for connecting to a corresponding one of the semiconductor light-emitting elements, and
a gap between the first main line portion and the second main line portion has a maximum size at element mounting positions of the semiconductor light-emitting elements, wherein the first line includes a plurality of the first connecting portions,
the second line includes a plurality of the second connecting portions, and
the first connecting portions, the second connecting portions and the semiconductor light-emitting elements are alternately positioned in an aligned direction of the semiconductor light-emitting elements.

11. The light-emitting device according to claim 10, wherein
the first main line portion connects adjacent ones of the first connecting portions,
the second main line portion connects adjacent ones of the second connecting portions,
the first connecting portions each includes a protruding portion which protrudes toward the second line in a region between adjacent ones of the element mounting positions, the protruding portion being a portion for connecting to a corresponding one of the semiconductor light-emitting elements, and
the second connecting portions each includes a protruding portion which protrudes toward the first line in a region between adjacent ones of the element mounting positions, the protruding portion being a portion for connecting to a corresponding one of the semiconductor light-emitting elements.

12. The light-emitting device according to claim 10,
wherein the element row includes a first element row and a second element row each of which includes the plurality of semiconductor light-emitting elements,
the light-emitting device further comprises a third line,
the first line and the second line are disposed such that the first element row is interposed therebetween,
the second line and the third line are disposed such that the second element row is interposed therebetween,
the third line includes a third main line portion extending mainly in a row direction of the second element row, and a third connecting portion connected to the third main line portion for connecting to a corresponding one of the semiconductor light-emitting elements in the second element row,
the third connecting portion includes a protruding portion which protrudes toward the second line in a region between adjacent ones of the element mounting positions in the second element row, the protruding portion being a portion for connecting to a corresponding one of the semiconductor light-emitting elements in the second element row,
the second connecting portion further includes a protruding portion which protrudes toward the third line in a region between adjacent ones of the element mounting positions which are adjacent to each other,
the gap between the first main line portion and the second main line portion has the maximum size at element mounting positions of the semiconductor light-emitting elements in the first element row, and
a gap between the second main line portion and the third main line portion is larger at element mounting positions of the semiconductor light-emitting elements in the second element row than at positions other than the element mounting positions of the semiconductor light-emitting elements in the second element row.

13. The light-emitting device according to claim 12, wherein the semiconductor light-emitting elements in the first element row and the semiconductor light-emitting elements in the second element row are alternately mounted to avoid facing each other, and
the second line is formed to protrude alternately to a region between adjacent ones of the semiconductor light-emitting elements in the first element row and to a region between adjacent ones of the semiconductor light-emitting elements in the second element row.

14. The light-emitting device according to claim 10, further comprising a sealing member which has a linear shape, includes a light wavelength converter, and collectively seals the semiconductor light-emitting elements.

15. A lighting apparatus comprising the light-emitting device according to claim 10.

* * * * *